(12) United States Patent
Wang et al.

(10) Patent No.: US 8,269,352 B2
(45) Date of Patent: *Sep. 18, 2012

(54) MULTI-CHIP STACK PACKAGE STRUCTURE

(75) Inventors: David Wei Wang, Hsinchu (TW);
 An-Hong Liu, Hsinchu (TW);
 Hsiang-Ming Huang, Hsinchu (TW);
 Jar-Dar Yang, Hsinchu (TW);
 Yi-Chang Lee, Hsinchu (TW)

(73) Assignee: Chipmos Technologies Inc., Hsinchu (TW)

(*) Notice: Subject to any disclaimer, the term of this patent is extended or adjusted under 35 U.S.C. 154(b) by 37 days.

This patent is subject to a terminal disclaimer.

(21) Appl. No.: 13/004,946

(22) Filed: Jan. 12, 2011

(65) Prior Publication Data

US 2011/0309496 A1 Dec. 22, 2011

(30) Foreign Application Priority Data

Jun. 18, 2010 (TW) ............................... 99119781 A

(51) Int. Cl.
 *H01L 23/48* (2006.01)

(52) U.S. Cl. ........ 257/777; 257/686; 257/690; 257/737; 257/778; 257/784; 257/E23.013; 257/E23.021; 257/E23.027; 257/E23.068; 257/E23.141; 257/E23.169

(58) Field of Classification Search .................. 257/621, 257/686, 690, 737, 774, 777, 784, E23.068, 257/E23.141, E23.169, E23.174, E25.013, 257/E25.021, E25.027

See application file for complete search history.

(56) References Cited

U.S. PATENT DOCUMENTS

| | | | | |
|---|---|---|---|---|
| 6,555,917 B1* | 4/2003 | Heo | ............................... | 257/777 |
| 2005/0045378 A1* | 3/2005 | Heng et al. | .................... | 174/260 |

* cited by examiner

*Primary Examiner* — Peniel M Gumedzoe
(74) *Attorney, Agent, or Firm* — Ming Chow; Sinorica, LLC

(57) ABSTRACT

A multi-chip stack package structure comprises a substrate, which has a chip placement area defined on its upper surface and a plurality of contacts disposed outside the chip placement area; a first chip is disposed in the chip placement area with the rear surface, a plurality of first pads being disposed on the active surface and a plurality of first bumps each being formed on one of the first pads; a plurality of metal wires connect the first bumps to the contacts; a second chip with a plurality of second pads being disposed on the active surface and a plurality of second bumps each being formed on one of the second pads, the second chip being mounted to the first chip with its active surface facing the active surface of the first chip, wherein the second bumps correspondingly connect the metal wires and the first bumps respectively.

13 Claims, 26 Drawing Sheets

MULTI-CHIP STACK PACKAGE STRUCTURE

BACKGROUND OF THE INVENTION

1. Field of the Invention

The present invention is related to a multi-chip stack package structure, and more particularly to a multi-chip stack package structure with metal wires directly connecting to bumps.

2. Description of the Prior Art

In the Information Age in which portable products are successfully developed, users keep seeking high-speed, high-quality, and multi-functional portable electronic products such as laptop computers, 3G mobile phones, PDA, and video game consoles. As far as the outer appearance of products is concerned, the trend is to design portable electronic products lighter, thinner; shorter, and smaller with versatile functions. To fulfill the requirements, the trend of developing multi-chip stack package structure is thus inevitable. In a multi-chip stack package structure, the horizontal package size remains the same but multiple chips are stacked vertically and electrically connected to each other to increase memory capacity or to obtain more functions.

As the manufacturing process advances, the operating speed and bandwidth required by buses between chips in portable systems keep increasing. The speed and bandwidth of system buses are determined by the packaging technology, particularly for System in Package (SiP) in which chips with various functions are encapsulated together. Therefore, the multi-chip stack structure is not only to be designed to have higher transmission speed, shorter transmission path, and better electrical performance, but also to further reduce package footprints and profiles. These features allow the multi-chip stack structures to be prevalently applied in all kinds of electronic products and become mainstream products in the future.

The packaging of multi-chip stack structure, however, is highly challenging when it comes to practical manufacturing process. First of all, as functions of all consumer products advance, higher memory capacity is also required. Therefore, when DRAM of high capacity, for example, a 4 Gb DRAM, is to be manufactured, four 1 Gb DRAMs need to be packaged altogether as shown in FIG. 13A; similarly, eight 1 Gb DRAMs need to be packaged altogether for manufacturing a 8 Gb DRAM. As the number of chips increases, problems may occur for conventional wire-bonded package structures in which metal wires are used to electrically connect the chips, such as lower signal transmission speed or time delay due to the increase of the connection paths or uneven lengths of bonding wires, which will further lead to problems such as system malfunction or data storage errors. Besides, package dimension problem also arises for the conventional wire-bonded multi-chip stack package structures due to bonding wires with the corresponding loop heights. That is to say, the extent of dimension reduction of a multi-chip stack package structure is quite limited, which is a major concern for the conventional wire-bonded chip stack package structures.

In order to solve the aforementioned problems, RDL (Redistribution Layer) is employed to shorten the wire connection paths for multi-chip stack structures and also to effectively overcome the problem of package height, as shown in FIG. 13B. However, high manufacturing cost of RDL has made many producers of high-performance products hang back from incorporating the technology.

Therefore, with the prerequisite of maintaining good electrical performance and the most suitable package size, manufacturing of the multi-chip stack structure with the lowest manufacturing cost has been a major challenge and solutions are eagerly demanded.

SUMMARY OF THE INVENTION

In order to solve the problems of excessive and uneven lengths of bonding wires between chips in multi-chip stack structure, the present invention provides a chip stack package structure in which metal wires are directly connecting bumps on chips, wherein a primary objective is to provide a multi-chip stack package in which the lengths of bonding wires connecting the plurality of chips are even, and thus better electrical performance and higher reliability of multi-chip stack structure after packaging can be achieved.

Another primary objective of the present invention is to provide a method of connecting the multi-chip stack structure by using conventional metal wires directly connecting bumps on chips to replace employment of RDL in order to reduce manufacturing cost of multi-chip stack structure.

Still another primary objective of the present invention is to provide a method of connecting the multi-chip stack structure by using conventional metal wires and TSVs (Through-Silicon-Vias), which effectively reduces heights of packages to increase integration density of stack packages, and also increases operation speeds and bandwidths.

And yet another primary objective of the present invention is to provide a method of connecting the multi-chip stack structure by using conventional metal wires directly connecting bumps on chips or a method of connecting the multi-chip stack structure by using conventional metal wires and TSVs in order to form a SiP structure.

According to the aforementioned objectives, the present invention first provides a multi-chip stack package structure, comprising a substrate with an upper surface and a lower surface, a chip placement area being defined on its upper surface and a plurality of contacts being disposed outside the chip placement area on its upper surface; a first chip having an active surface and a rear surface opposite to the active surface, which is mounted on the chip placement area by the rear surface and with a plurality of first pads disposed on the active surface and a plurality of first bumps each being formed on one of the first pads; a plurality of metal wires, which connect the first bumps to the contacts; a second chip having an active surface and a rear surface opposite to the active surface, a plurality of second pads disposed on the active surface and a plurality of second bumps each being formed on one of the second pads, the second chip being mounted to the first chip with its active surface facing the active surface of the first chip, wherein the second bumps correspondingly connect the metal wires and the first bumps respectively; and an encapsulant encapsulating the substrate, the first chip, the second chip, and the metal wires.

The present invention then provides a multi-chip stack package structure, comprising a substrate with an upper surface and a lower surface, a chip placement area being defined on its upper surface and a plurality of contacts being disposed outside the chip placement area on its upper surface; a first chip having an active surface and a rear surface opposite to the active surface, which is mounted on the chip placement area by the rear surface and with a plurality of first pads disposed on the active surface and a plurality of first bumps each being formed on one of the first pads; a second chip having an active surface, a rear surface opposite to the active surface, and a plurality of through silicon vias (TSVs), the TSVs penetrating through the second chip interconnecting the active surface and the rear surface and a plurality of second bumps being formed on the active surface and connected to the TSVs respectively, wherein the second chip is mounted to the first chip with its rear surface facing the active surface of the first chip and the TSVs being correspondingly connected to the first bumps respectively; a plurality of metal wires connecting the second bumps to the contacts; a third chip having an active surface, a rear surface opposite to the active surface and a plurality of TSVs, the TSVs penetrating through the third chip interconnecting the active surface and the rear surface and a plurality of third bumps being formed on the active surface and connected to the TSVs respectively, wherein the third chip is mounted to the second chip with its active surface facing the active surface of the second chip and the third bumps being correspondingly connected to the metal wires and the second bumps respectively; a fourth chip having an active surface and a rear surface opposite to the active surface, a plurality of second pads being disposed on the active surface and a plurality of fourth bumps each being formed on one of the second pads, wherein the fourth chip is mounted to the third chip with its active surface facing the rear surface of the third chip and the fourth bumps being correspondingly connected to the TSVs of the third chip respectively; and an encapsulant encapsulating the substrate, the first chip, the second chip, the third chip, the fourth chip, and the metal wires.

The present invention further provides a multi-chip stack package structure, comprising a substrate with an upper surface and a lower surface, a chip placement area with a cavity formed therein being defined on its upper surface and a plurality of contacts being disposed outside the chip placement area on its upper surface; a first chip having an active surface and a rear surface opposite to the active surface, which is disposed in the cavity by the rear surface and with a plurality of first pads disposed on the active surface and a plurality of first bumps each being formed on one of the first pads; a plurality of metal wires, which connect the first bumps to the contacts; a second chip having an active surface and a rear surface opposite to the active surface, a plurality of second pads being disposed on the active surface and a plurality of second bumps each being formed on one of the second pads, the second chip being mounted to the first chip with its active surface facing the active surface of the first chip, wherein the second bumps correspondingly connect the metal wires and the first bumps respectively; and an encapsulant encapsulating the substrate, the first chip, the second chip, and the metal wires.

The present invention then provides a multi-chip stack package structure, comprising a substrate with an upper surface and a lower surface, a chip placement area with a cavity formed therein being defined on its upper surface and a plurality of contacts being disposed outside the chip placement area on its upper surface; a first chip having an active surface and a rear surface opposite to the active surface, which is disposed in the cavity by the rear surface and with a plurality of first pads disposed on the active surface and a plurality of first bumps each being formed on one of the first pads; a second chip having an active surface, a rear surface opposite to the active surface, and a plurality of TSVs, the TSVs penetrating through the second chip interconnecting the active surface and the rear surface and a plurality of second bumps being formed on the active surface and connected to the TSVs respectively, wherein the second chip is mounted to the first chip with its rear surface facing the active surface of the first chip and the TSVs being correspondingly connected to the first bumps respectively; a plurality of metal wires, which connect the plurality of second bumps to the contacts; a third chip having an active surface, a rear surface opposite to the active surface, and a plurality of TSVs, the TSVs penetrating through the third chip interconnecting the active surface and the rear surface and a plurality of third bumps being formed on the active surface and connecting the TSVs respectively, wherein the third chip is mounted to the second chip with its active surface facing the active surface of the second chip and the third bumps being correspondingly connected to the metal wires and the second bumps respectively; a fourth chip having an active surface and a rear surface opposite to the active surface, a plurality of second pads being disposed on the active surface and a plurality of fourth bumps each being formed on one of the second pads, wherein the fourth chip is mounted to the third chip with its active surface facing the rear surface of the third chip and the fourth bumps being correspondingly connected to the TSVs of the third chip respectively; and an encapsulant encapsulating the substrate, the first chip, the second chip, the third chip, the fourth chip, and the metal wires.

The present invention further provides a multi-chip stack package structure, comprising a substrate with an upper surface and a lower surface, a chip placement area being defined on its upper surface and a plurality of contacts being disposed outside the chip placement area on its upper surface; a first chip having an active surface and a rear surface opposite to the active surface, which is mounted on the chip placement area by the rear surface and with a plurality of first pads disposed on the peripheral regions of the active surface and a plurality of first bumps each being formed on one of the first pads; a plurality of metal wires, which connect the plurality of first bumps to the contacts; a second chip having an active surface, a rear surface opposite to the active surface, and a plurality of TSVs, each of the TSVs penetrating through the second chip interconnecting the active surface and the rear surface and forming a first end on the active surface and a second end on the rear surface, a plurality of second bumps being respectively formed on the second ends of at least a portion of the TSVs, wherein the second chip is mounted to the first chip with its rear surface facing the active surface of the first chip and the second bumps being correspondingly connected to the metal wires and the first bumps respectively; a third chip having an active surface, a rear surface opposite to the active surface, and a plurality of TSVs, each of the TSVs penetrating through the third chip interconnecting the active surface and the rear surface and forming a first end on the active surface and a second end on the rear surface, a plurality of third bumps being respectively formed on the second ends of at least a portion of the TSVs, wherein the third chip is mounted to the second chip with its rear surface facing the active surface of the second chip and the third bumps being correspondingly connected to the first ends of the TSVs of the second chip respectively; and an encapsulant encapsulating the substrate, the first chip, the second chip, the third chip, and the metal wires.

DESCRIPTION OF THE PREFERRED EMBODIMENT

The present invention herein discloses a multi-chip stack package structure with metal wires directly connecting the interconnect points (bumps) of two chips to the substrate. A primary objective of which is to provide the multi-chip stack package with connection wires of even lengths so that better electrical performance and higher reliability can be achieved for the multi-chip stack structure after packaged. To thoroughly understand the present invention, procedures and composition of the structure are described in detail in the following. Apparently, methods for stacking chips are not limited in the application of the present invention, particularly methods for stacking chips known to persons skilled in the art. On the other hand, to avoid unnecessary limits on the present invention, well-known procedures of process such as chip forming and chip thinning are not described in detail in the following. However, preferred embodiments of the present invention are described in detail as below. In addition to these embodiments detailedly described, the present invention can also be widely applied in other embodiments. The scope of the invention is not limited and is determined by the appended claims.

Figure 1:
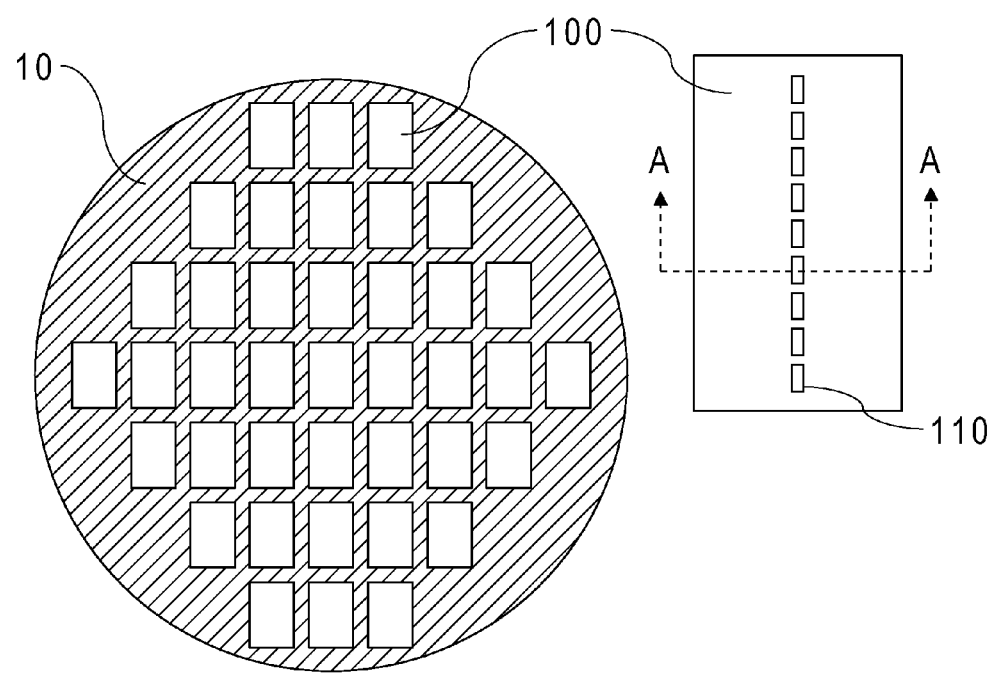
FIG. 1 is a top view of a wafer and chips thereof of the prior art.

First, referring to FIG. 1, in current semiconductor packaging process, the sawing process is performed on a wafer 10 that has gone through the front-end process to form chips 100, wherein a plurality of pads 110 are disposed on the active surface of each chip 100; in the embodiment of the present invention, the plurality of pads 110 disposed on the active surface of each chip 100 are located in the central area of the active surface, as shown in FIG. 1.

Figure 2A:
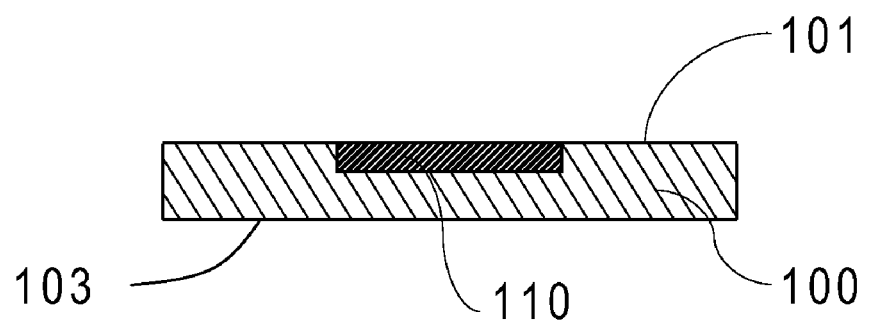
FIG. 2A to 2I are cross-sectional views of an embodiment for forming a multi-chip stack package structure of the present invention.
Figure 2B:
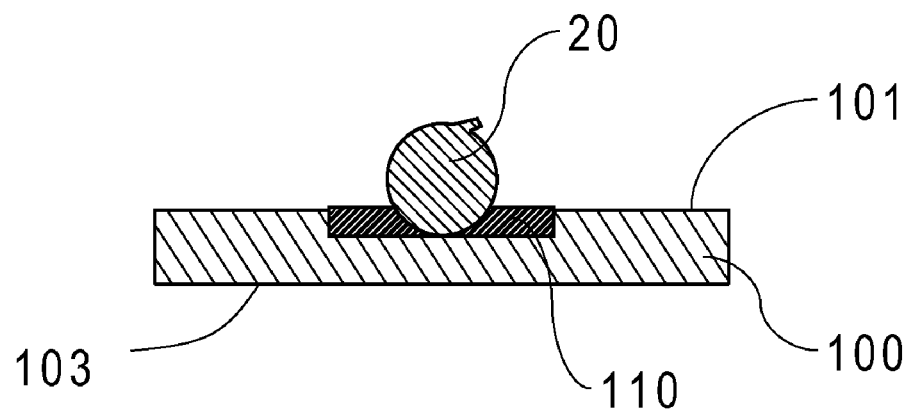
Figure 2C:
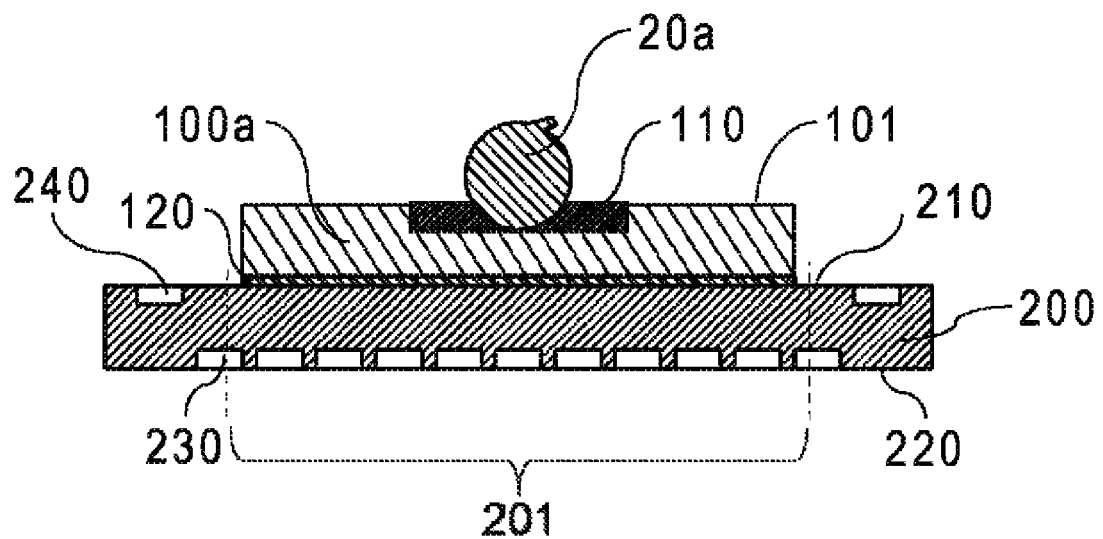
Figure 2D:
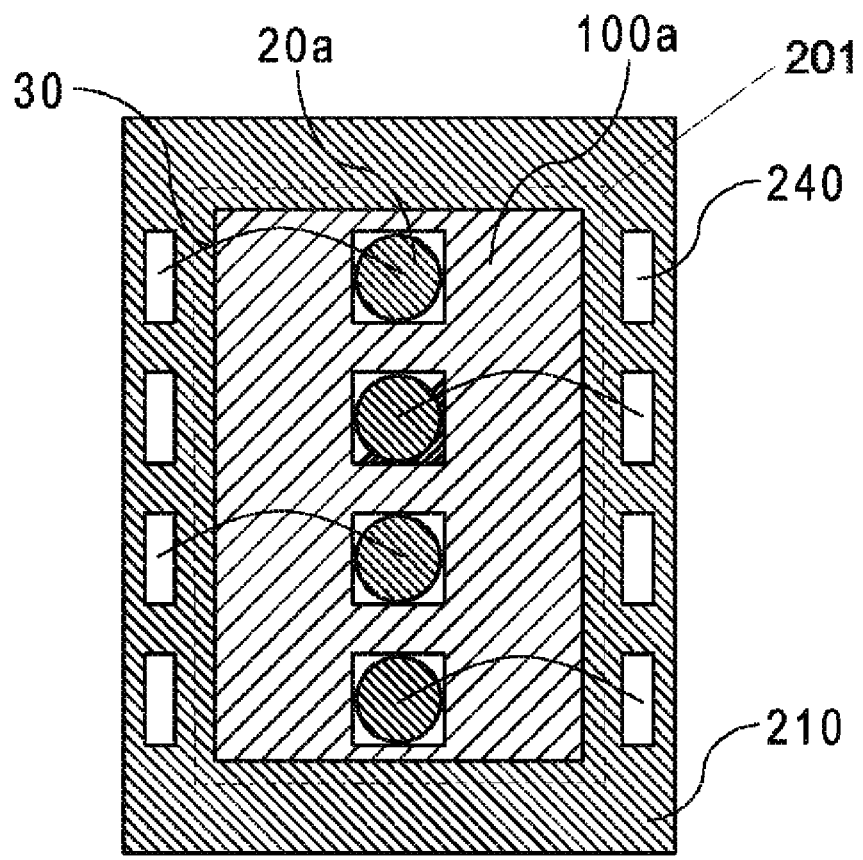
Figure 2E:
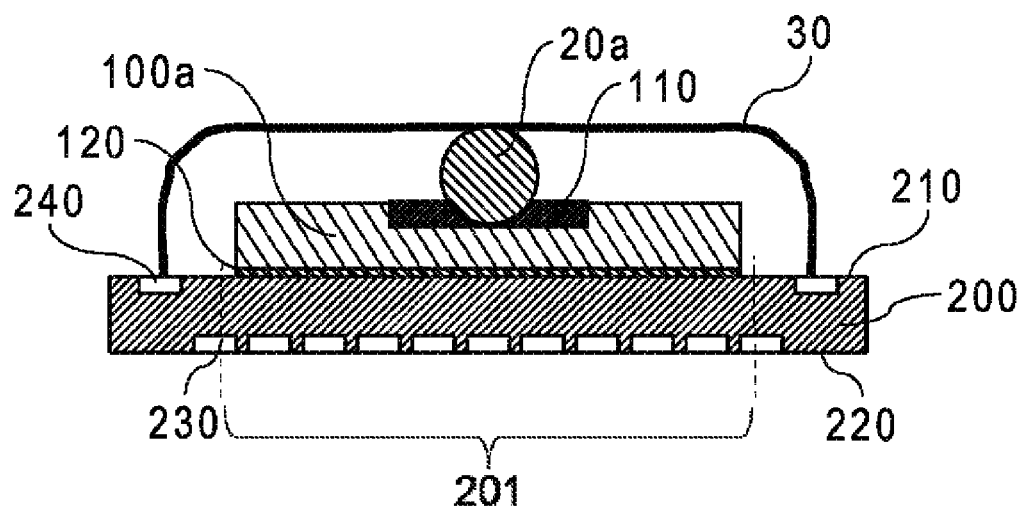
Figure 4:
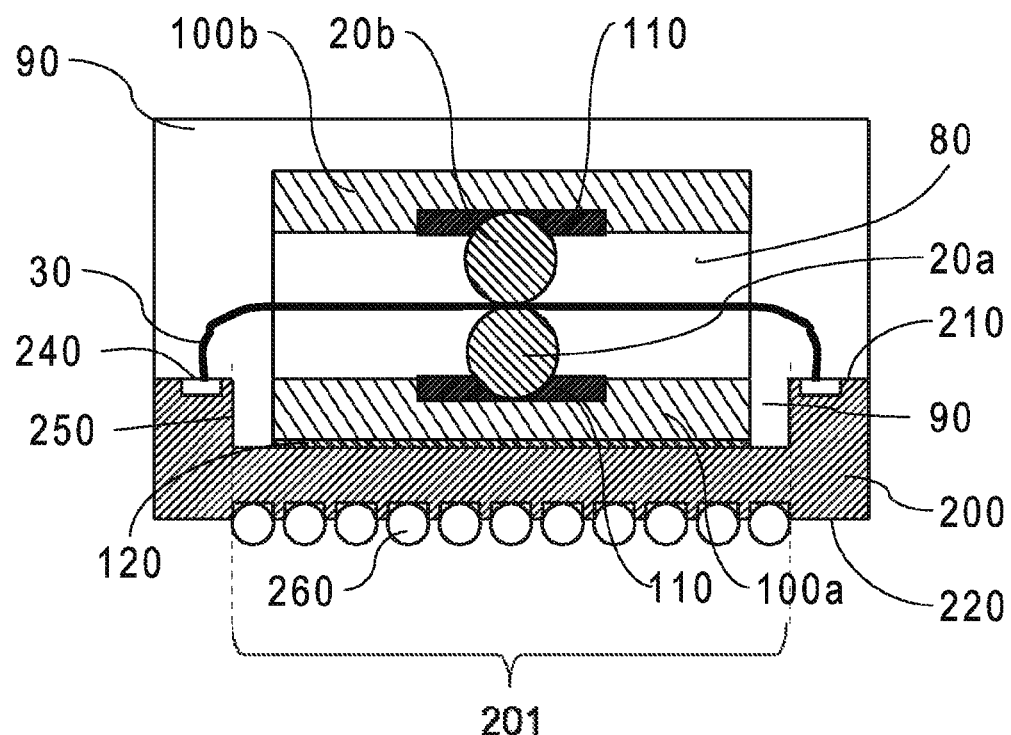
FIG. 4 is a cross-sectional view of still another embodiment of multi-chip stack package structure of the present invention.

Then, referring to FIGS. 2A to 2H, which are cross-sectional views of an embodiment for forming the multi-chip stack package structure of the present invention. First, as shown in FIG. 2A, each of the chips 100 has an active surface 101 and a rear surface 103 opposite to it. A plurality of pads 110 are disposed on the active surface 101 and located in the central area of the active surface 101 of the chip 100. Then, referring to FIG. 2B, a bump 20, and more particularly, a stud bump, is formed on the pad 110 by using wire bonding method to form a sintered bump. What is to be emphasized here is that, the bump 20 can be an electroplated bump, an electroless bump, a stud bump, a conductive polymer bump, a compliant bump or a metal composite bump, which is not limited in the present invention. The material of bump 20 can be selected from the group consisting of: copper, gold, silver, indium, nickel/gold, nickel/palladium/gold, copper/palladium/gold, copper/gold, aluminum, conductive polymer material, or combinations of materials above. Now, a plurality of chips 100 with the bumps 20 formed thereupon are completed. Then, referring to FIG. 2C, the rear surface 103 of a first chip 100a as shown in FIG. 2B is mounted to the upper surface 210 of the substrate 200 via the adhesive layer 120, wherein a chip placement area 201 is defined on the upper surface 210 of the substrate 200 of the present invention and a plurality of contacts 240 are disposed outside the chip placement area 201 on the upper surface 210, and the first chip 100a is mounted in the chip placement area 201 of the substrate 200 via the adhesive layer 120. Moreover, a plurality of external terminals 230 are disposed on the lower surface 220 of the substrate 200 and can further have electrical connection components such as solder balls (as shown in FIG. 4) disposed thereon for external electrical connection. Furthermore, referring to FIG. 2D, the first bumps 20a on the first chip 100a as shown in FIG. 2C are electrically connected to the contacts 240 on the substrate 200 with a plurality of metal wires 30, as shown in FIGS. 2D and 2E, wherein FIG. 2D is a top view of FIG. 2E. The metal wires 30 can be formed by applying optionally a reverse wire bonding process. Then, referring to FIG. 2F, a second chip 100b as shown in FIG. 2B is connected to the first chip 100a as shown in FIG. 2E in flip-chip manner, and thus the second bumps 20b of the second chip 100b correspondingly connect to the metal wires 30 and the first bumps 20a of the first chip 100a respectively. Therefore, the second chip 100b is electrically connected to the first chip 100a and further electrically connected to the substrate 200 with metal wires 30.

Moreover, what is to be explained in particular is that, when the material of bump 20 in the embodiment described above is a soft metal material such as gold, the properties of soft metal such as low hardness, high toughness, and good compliancy to coplanarity not only can compensate the longitudinal or vertical deformation occurring at the connection interface of electrodes (i.e. bumps) due to CTE (coefficients of thermal expansion) mismatch between metal electrode materials in the process of vertical multi-chip stacking, but also can effectively eliminate the problem of roughness of metal electrode materials. Therefore, the reliability of the process and products of vertical multi-chip stacking can be effectively improved.

Figure 2F:
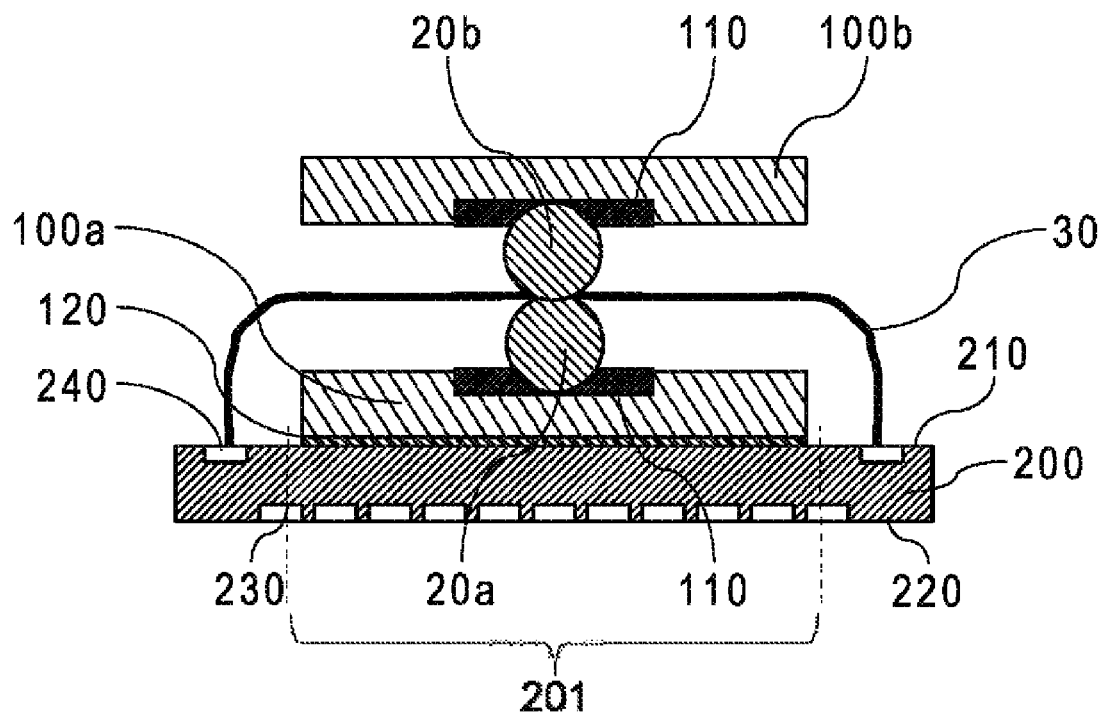
Figure 2G:
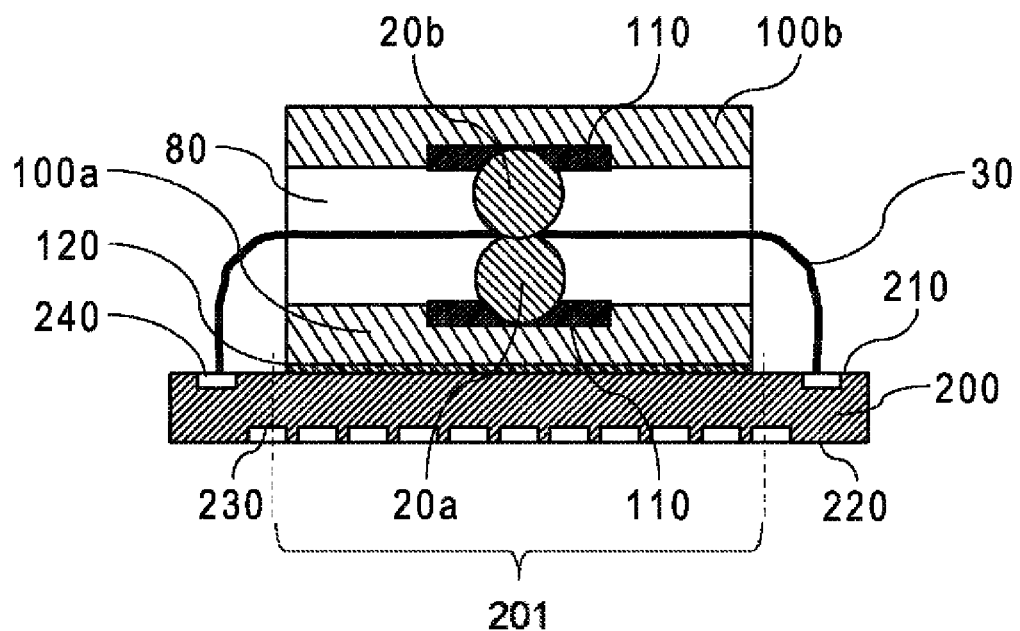

Then, referring to FIG. 2G, a polymer material filling process is optionally performed to fill polymer material into the space between the active surfaces 101 of the chips 100a and 100b to form a sealing layer 80 so as to stabilize the stack structure and protect the electrical connections. The filling process can be performed after the process shown in FIG. 2F is completed with the polymer material filled in the gap between the chips 100a and 100b by applying high pressure. Or the polymer material can be coated on or adhered to the active surface 101 of the first chip 100a shown in FIG. 2E before the second chip 100b is connected to the first chip 100a in flip-chip manner The material of sealing layer 80 can be selected from the group consisting of: NCP (non-conductive paste), NCF (non-conductive film), ACP (anisotropic conductive paste), ACF (anisotropic conductive film), underfill, non-flow underfill, B-stage resin, molding compounds, and FOW (film-over-wire).

Figure 2H:
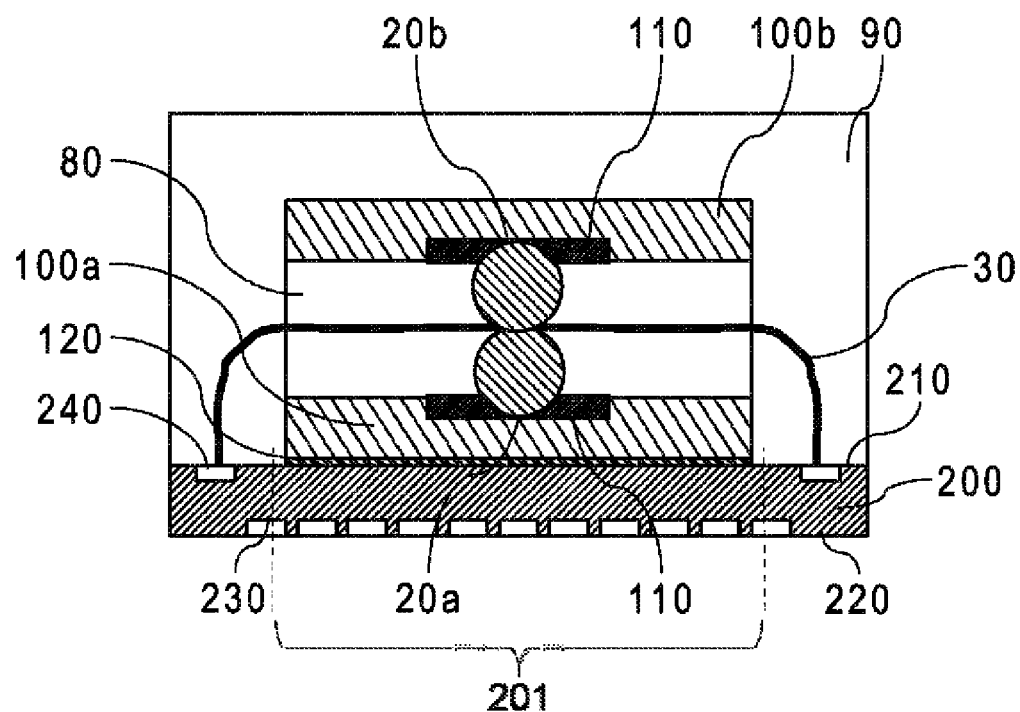

Finally, an encapsulating process is performed to form an encapsulant 90 to encapsulate the substrate 200, the first chip 100a, the second chip 100b, and the metal wires 30. Till this stage, the multi-chip stack package structure of the present embodiment is completed, as shown in FIG. 2H.

Figure 13A:
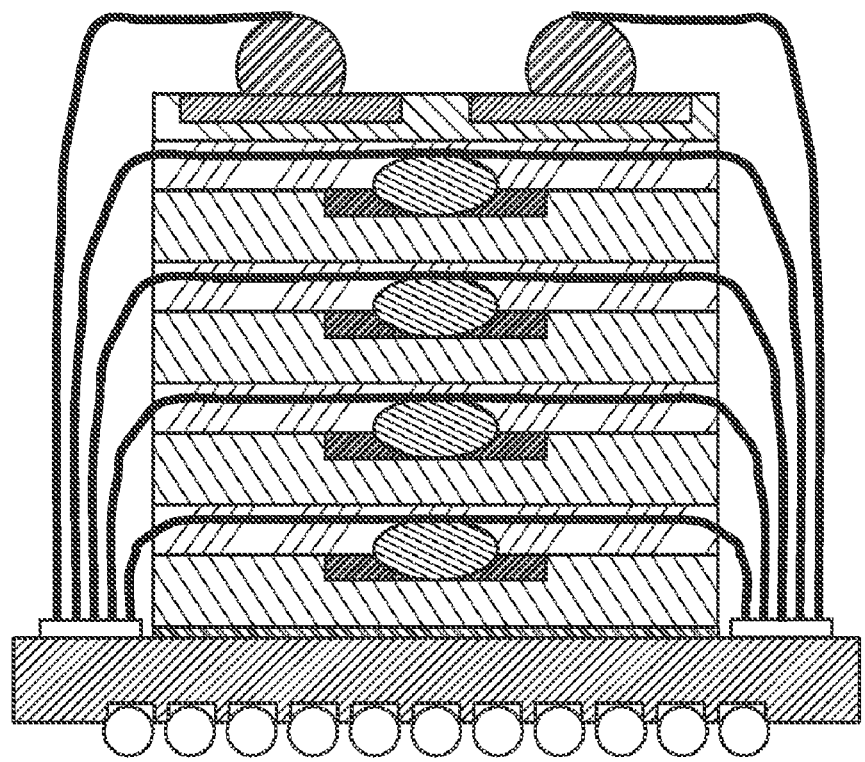
FIGS. 13A and 13B are cross-sectional views of multi-chip stack package structures of the prior art.
Figure 13B:
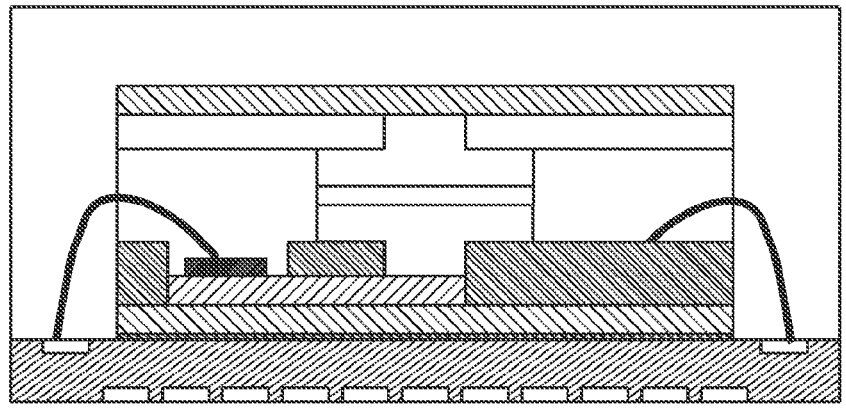

In the multi-chip stack package structure of the present embodiment, the plurality of pads 110 on the active surfaces 101 of the chips 100a and 100b are correspondingly connected to each other via the bumps 20a and 20b in flip-chip manner and are further connected to the contacts 240 on the upper surface 210 of the substrate 200 with the metal wires 30. Apparently, in the present embodiment, each of the metal wires 30 connecting each pad 110 on the active surface 101 of each chip 100 to each corresponding contact 240 on the upper surface 210 of the substrate 200 is of the same length. Therefore, the problem of time delay of signal transmission due to the metal wires of different lengths used by the same pin assignments on different chips, as shown in FIG. 13A, which may further lead to problems such as system malfunction or data storage errors, can thus be eliminated. Thus, better electrical performance and reliability are achieved by the present embodiment.

Figure 2I:
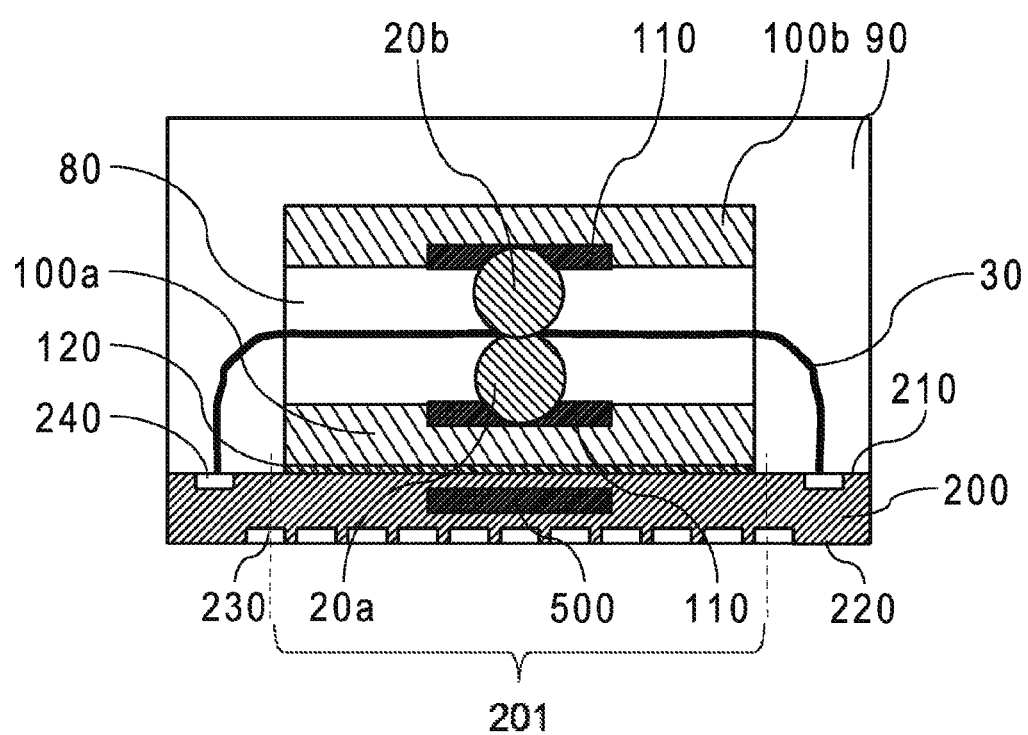

Then, referring to FIG. 2I, a controller chip 500 is embedded in the substrate 200 and is electrically connected to the substrate 200 so that the active surface of the controller chip 500 is electrically connected to the plurality of external terminals 230 disposed on the lower surface 220 of the substrate 200 via traces laid out in the substrate 200. In addition, the controller chip 500 can be embedded in the substrate 200 during the process of forming multilayer circuit board (substrate) so that the controller chip 500 is disposed within the substrate 200. Since embedding a controller chip 500 in a substrate 200 is a known technology, it is not described in detail. Apparently, the difference between FIG. 2I and FIG. 2H is that a controller chip 500 embedded in substrate 200 is further disposed in FIG. 2I, while the rest process of connecting the first chip 100a and the second chip 100b is the same as what is shown in FIGS. 2C to 2H and is not repeatedly described.

Figure 3:
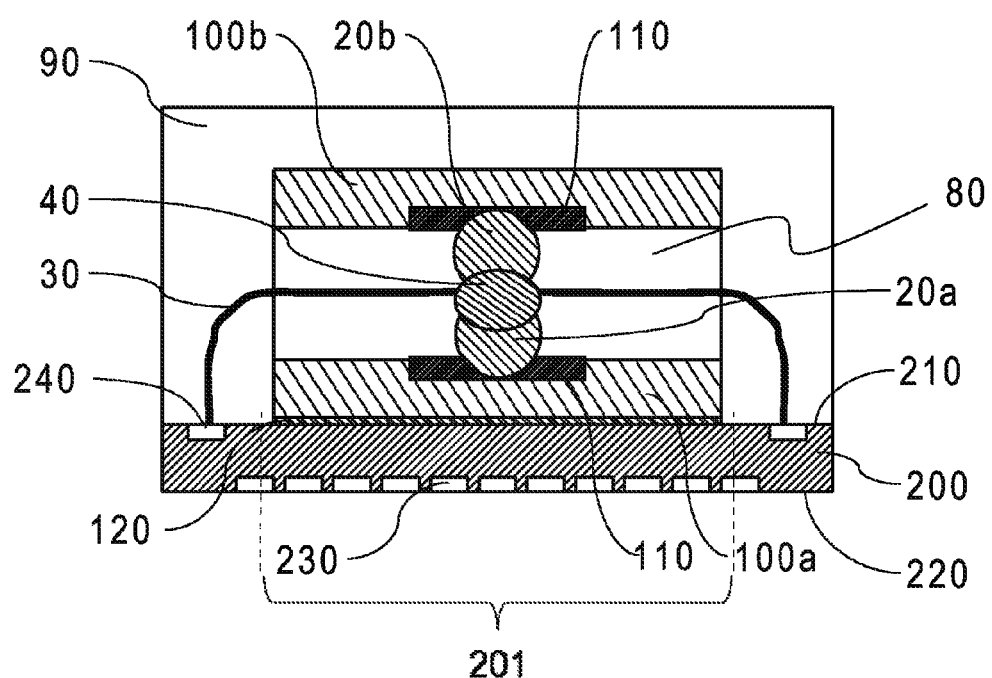
FIG. 3 is a cross-sectional view of another embodiment of multi-chip stack structure of the present invention.

Referring to FIG. 3, which is a cross-sectional view of another embodiment of multi-chip stack structure of the present invention. In the present embodiment, after the structure in FIG. 2E described above is completed, another stud bump 40 is further formed on the contact point of each metal wire 30 and the first bump 20a. The stud bump 40 is formed by wire bonding process to form a sintered bump bonded on the contact point of the metal wire 30 and the first bump 20a in order to reinforce the bonding strength of the metal wire 30 and provide buffer for subsequent flip-chip bonding. Then, a second chip 100b as shown in FIG. 2B is connected to the first chip 100a in flip-chip manner so that the second bumps 20b of the second chip 100b are correspondingly connected to the stud bumps 40 respectively. Thus, the second chip 100b is electrically connected to the first chip 100a and is further electrically connected to the substrate 200 via the metal wires 30. The number of stud bump 40 bonded on the contact point of each metal wire 30 and the first bump 20a is not limited in the present embodiment and can be adjusted according to electrical or height requirements. Similarly, a polymer material filling process is optionally performed to form a sealing layer 80 in the space between the active surfaces 101 of the chips 100a and 100b. The method and material for forming the sealing layer 80 are the same as that in the aforementioned embodiment and are not repeated herein. Finally, an encapsulating process is performed to form an encapsulant 90 to encapsulate the substrate 200, the first chip 100a, the second chip 100b, and the metal wires 30.

In the multi-chip stack package structure of the present embodiment, the plurality of pads 110 on the active surfaces 101 of the chips 100a and 100b are correspondingly connected to each other via the bumps 20a, 20b and 40 in flip-chip manner and are further connected to the contacts 240 on the upper surface 210 of the substrate 200 with the metal wires 30. Apparently, in the present embodiment, each of the metal wires 30 connecting each pad 110 on the active surface 101 of each chip 100 to each corresponding contact 240 on the upper surface 210 of the substrate 200 is of the same length. Therefore, the problem of time delay of signal transmission due to the metal wires of different lengths used by the same pin assignments on different chips which may lead to problems such as system malfunction or data storage errors can thus be eliminated. Thus, better electrical performance and reliability are achieved by the present embodiment.

Then, referring to FIG. 4, which is a cross-sectional view of still another embodiment of multi-chip stack package structure of the present invention. Similarly, a chip placement area 201 is defined on the upper surface 210 of the substrate 200 of the present embodiment, and a plurality of contacts 240 are disposed on the upper surface 210. A cavity 250 is formed in the chip placement area 201 and the contacts 240 are located outside the chip placement area 201, wherein the length and width of the cavity 250 are larger than the length and width of the chip 100. Thus a first chip 100a as shown in FIG. 2B can be mounted into the cavity 250 with its rear surface 103 attached therein via an adhesive layer 120. Then, a reverse wire bonding process can be selected to electrically connect the first bumps 20a on the active surface 101 of the first chip 100a to the contacts 240 on the substrate 200 with a plurality of metal wires 30. Apparently, with proper design of the cavity 250 in the substrate 200, for example, the depth of cavity 250 designed to be approximate to the thickness of the first chip 100a, the contacts 240 on the upper surface 210 of the substrate 200 and the first bumps 20a on the first chip 100a are at about the approximate height when the first chip 100a is mounted into the cavity 250. Thus the plurality of metal wires 30 electrically connecting the contacts 240 on the substrate 200 and the first bumps 20a on the first chip 100a can be with the lowest loop height and the shortest length, allowing the multi-chip stack structure to have the best electrical performance. Then, the second bumps 20b on a second chip 100b as shown in FIG. 2B are correspondingly connect to the metal wires 30 and the first bumps 20a on the first chip 100a mounted into the cavity 250 respectively via flip-chip connection to form a multi-chip stack structure. Similarly, a polymer material filling process can be optionally performed to form a sealing layer 80 in the space between the active surfaces 101 of the chips 100a and 100b to stabilize the stack structure and protect the electrical connections. Moreover, an encapsulating process is performed to form an encapsulant 90 to encapsulate the substrate 200, the first chip 100a, the second chip 100b, and the metal wires 30, and the gaps between the first chip 100a and the cavity 250 is simultaneously filled with the encapsulant 90. The sealing layer filling process and the encapsulating process and the materials used are the same as those in the previous embodiment and detailed descriptions are omitted herein. Finally, a ball mounting process can be performed, wherein solder balls 260 are disposed on the plurality of external terminals 230 on the lower surface 220 of the substrate 200 and serve as external electrical connection components. Therefore, when each chip 100 in this stack structure is a 1 Gb DRAM, the multi-chip stack package structure would be a 2 Gb DRAM device with a lower package profile than conventional wire-bonding opponents, which can be applied in portable electronic products such as laptop computers, 3G mobile phones, PDA, and video game consoles.

Apparently, in the embodiment shown in FIG. 4, metal wires 30 with the most preferred length (ie. shortest) are used to connect the bumps 20a and 20b on the chips 100a and 100b to the contacts 240 of the substrate 200 so that better electrical performance and reliability can be achieved in the embodiment. Moreover, with the deployment of the cavity 250 on the substrate 200, the overall height of the multi-chip stack package structure can also be considerably reduced. Furthermore, as in FIG. 3, a stud bump 40 can also be further formed on the contact point of each metal wire 30 and the first bump 20a after the metal wires 30 connect the first bumps 20a on the first chip 100a to the contacts 240 on the substrate 200 in the present embodiment so as to reinforce the bonding strength of the metal wires 30 and provide buffer for subsequent flip-chip bonding. Thus, better CTE (coefficients of thermal expansion) matching of metal electrode materials in the multi-chip stack package structure can be achieved and the reliability of the package structure can be improved.

Figure 5A:
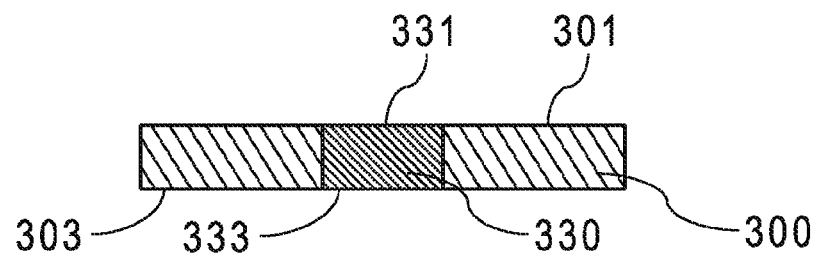
FIG. 5A to 5F are cross-sectional views of an embodiment of multi-chip stack package structure with TSVs of the present invention.

Referring then to FIGS. 5A to 5E, which are cross-sectional views of an embodiment of multi-chip stack package structure with through silicon vias (TSVs) of the present invention. First, as shown in FIG. 5A, which is a cross-sectional view of chip 300 with TSVs of the present invention. The chip 300 has an active surface 301 and a rear surface 303 opposite to the active surface 301, and a plurality of vertical through holes penetrating through the chip 300 are formed in the chip 300. The method for forming through holes can be selected from the group consisting of: laser drilling, dry etching, and wet etching, etc. The width of through holes can range between 1 μm and 50 μm, and a preferred width is between 10 um and 20 um. TSVs 330 are further formed in the through holes interconnecting the active surface 301 and the rear surface 303. The first ends 331 of these TSVs 330 are neighboring to the active surface 301 of the chip 300, and the opposite second ends 333 are neighboring to the rear surface 303 of the chip 300. The material of TSVs 330 can be selected from the group consisting of: copper, tungsten, nickel, aluminum, gold, poly-silicon, conductive polymer or combinations of materials above. And in the present embodiment, the TSVs 330 are disposed in the central area of the chip 300.

Figure 5B:
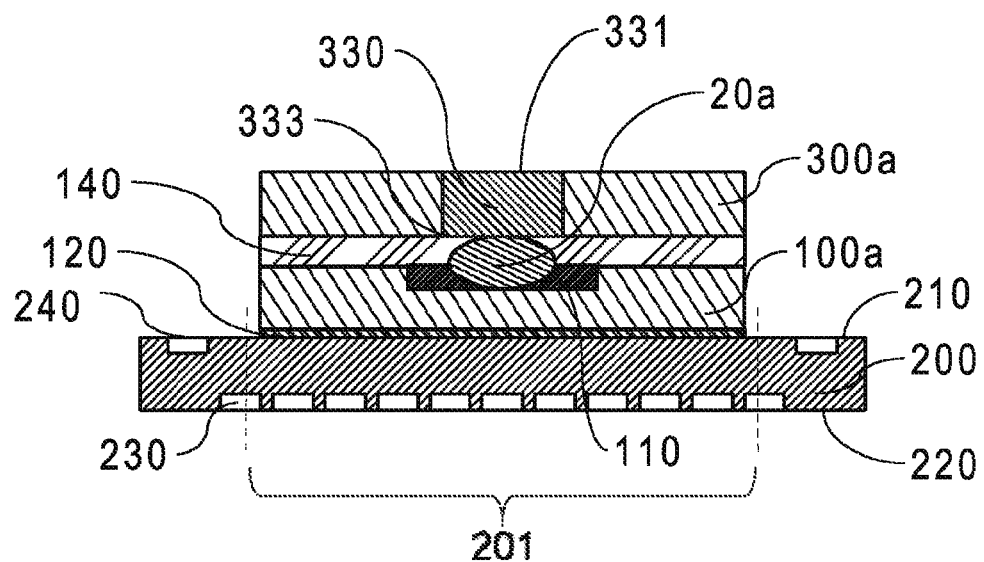

Then, referring to FIG. 5B, a second chip 300a with a plurality of TSVs 330 as shown in FIG. 5A is connected to the first chip 100a as shown in FIG. 2C to form a first stack structure, wherein in this first stack structure, the second ends 333 of the plurality of TSVs 330 of the second chip 300a are correspondingly electrically connected to the first bumps 20a of the first chip 100a respectively. Similarly, in a preferred embodiment, a sealing layer 140 can be formed between the first chip 100a and the second chip 300a to stabilize the first stack structure. The sealing layer 140 can be first formed on the active surface 101 of the first chip 100a before the second chip 300a is connected to the first chip 100a, or formed after the whole multi-chip stack structure is completed. The filling process and the material of the sealing layer 140 are the same as those of the aforementioned sealing layer 80 and detailed descriptions are omitted herein.

Figure 5C:
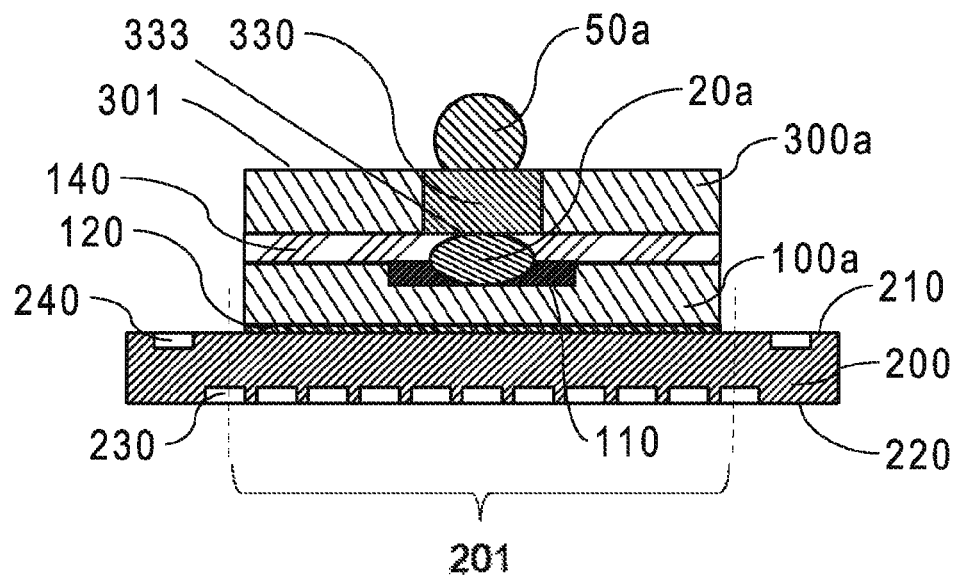
Figure 5D:
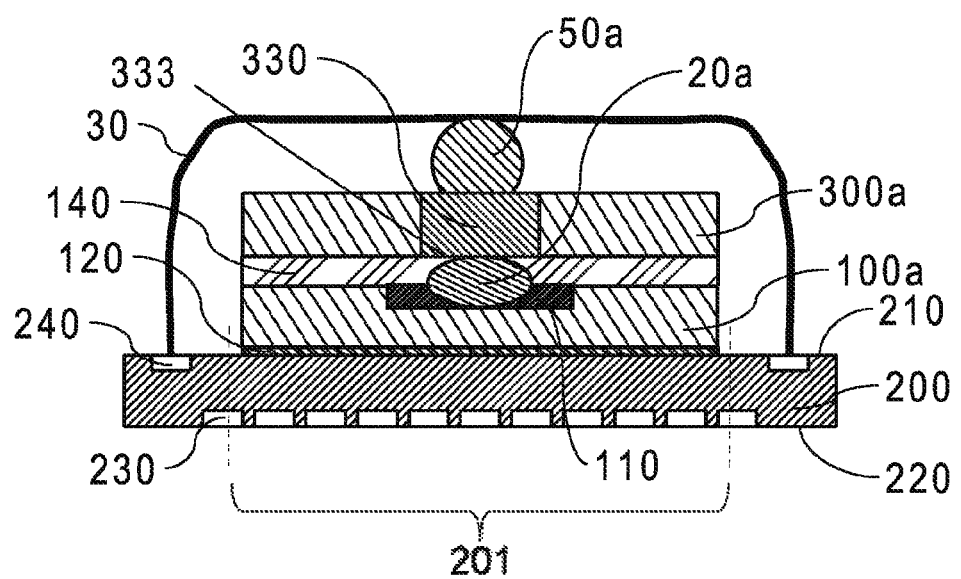

Then, referring to FIG. 5C, a plurality of second bumps 50a are formed on the first ends 331 of the plurality of TSVs 330 of the second chip 300a. The form and material of the second bumps 50a are the same as those of the aforementioned bumps 20. Then, as shown in FIG. 5D, the second bumps 50a on the second chip 300a as shown in FIG. 5C are electrically connected to the contacts 240 on the substrate 200 with a plurality of metal wires 30. Reverse wire bonding can be applied to form the metal wires 30.

Figure 5E:
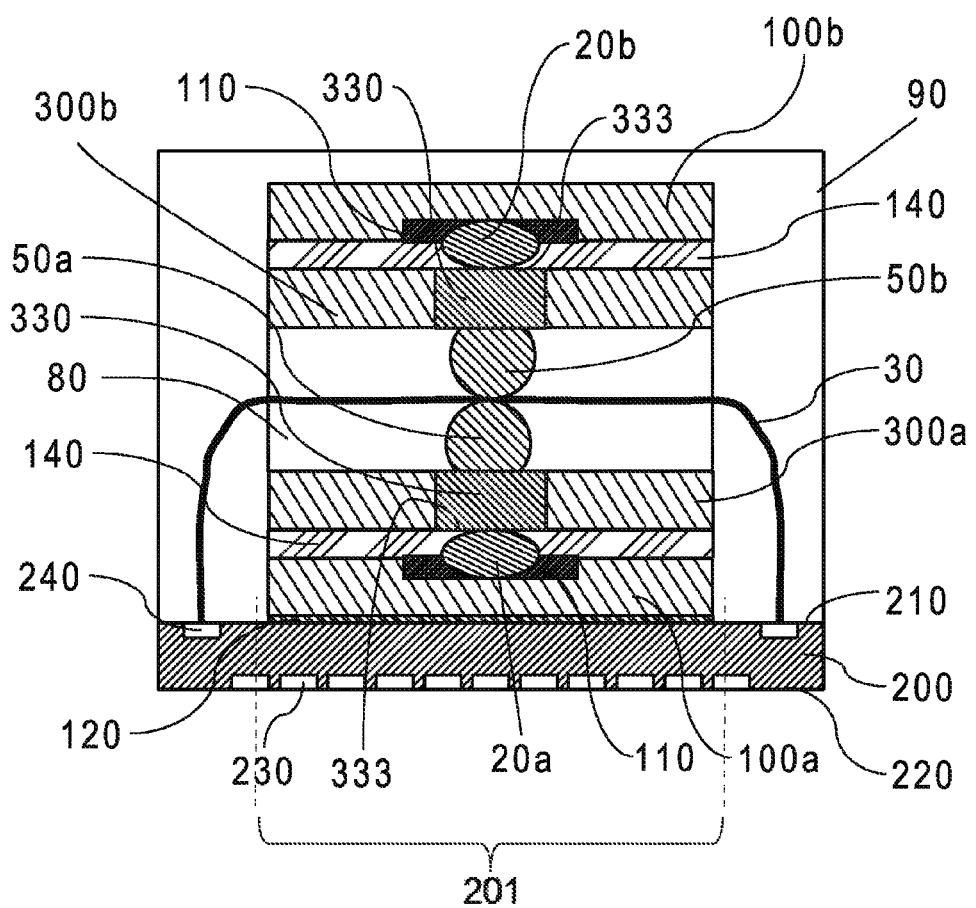

In addition, with the similar process, a second stack structure is formed by electrically connecting a third chip 300b as shown in FIG. 5A and a fourth chip 100b as shown in FIG. 2B, wherein the second ends 333 of the plurality of TSVs 330 of the third chip 300b are correspondingly electrically connected to the fourth bumps 20b on the fourth chip 100b respectively. Similarly, a sealing layer 140 can be formed between the third chip 300b and the fourth chip 100b to obtain a stable second stack structure. Then, a plurality of third bumps 50b are formed on the first ends 331 of the plurality of TSVs 330 of the third chip 300b in the second stack structure. Next, in flip-chip manner, the third bumps 50b on the third chip 300b of the second stack structure are correspondingly connected to the metal wires 30 and the second bumps 50a on the second chip 300a of the first stack structure respectively to form a multi-chip stack structure with four chips, 100a, 100b, 300a, and 300b, as shown in FIG. 5E. Moreover, in the present embodiment, the third chip 300b and the second chip 300a can be first electrically connected with the third bumps 50b correspondingly connected to the metal wires 30 and the second bumps 50a on the second chip 300a respectively after the third bumps 50b are formed on the third chip 300b. The fourth chip 100b is then connected to the third chip 300b in flip-chip manner with the fourth bumps 20b on the fourth chip 100b being correspondingly connected to the second ends 333 of the TSVs 330 of the third chip 300b respectively to form a multi-chip stack structure as shown in FIG. 5E.

Similarly, a polymer material filling process can be optionally performed to form a sealing layer 80 in the space between the first stack structure and the second stack structure and also a sealing layer 140 between the first chip 100a and the second chip 300a and between the third chip 300b and the fourth chip 100b to stabilize the multi-chip stack structure. An encapsulating process is then performed to form an encapsulant 90 to encapsulate the substrate 200, the first chip 100a, the second chip 300a, the third chip 300b, the fourth chip 100b, and the metal wires 30. The filling process for forming sealing layers 80 and 140 and the encapsulating process and the materials thereof are the same as those of the aforementioned embodiment and are not repeatedly described here. Finally, solder balls (not shown in FIG. 5E) can be further disposed on the plurality of external terminals 230 on the lower surface 220 of the substrate 200 as external electrical connection components. Apparently, when each chip 100/300 in the stack structure is a 1 Gb DRAM, the multi-chip stack package structure would be a 4 Gb DRAM device, which can be applied in portable electronic products such as laptop computers, 3G mobile phones, PDA, and video game consoles.

Figure 5F:
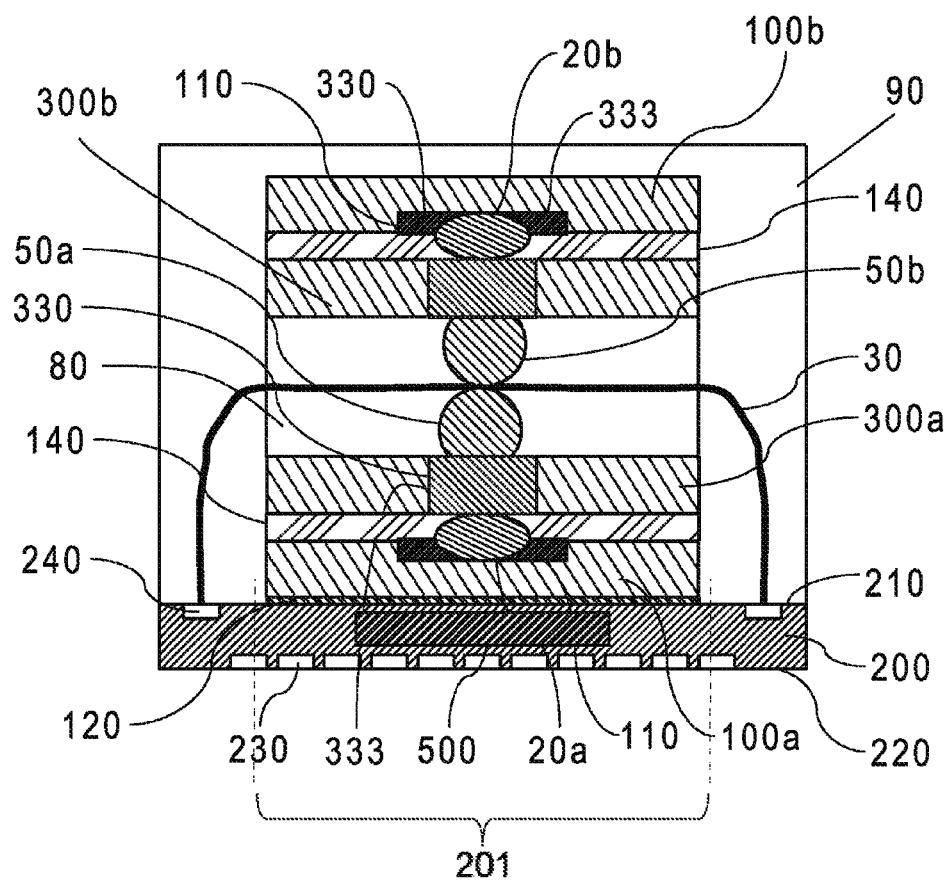

Then, referring to FIG. 5F, a controller chip 500 is embedded in the substrate 200 and is electrically connected to the substrate 200 so that the active surface of the controller chip 500 is electrically connected to the plurality of external terminals 230 disposed on the lower surface 220 of the substrate 200 via traces laid out in the substrate 200. In addition, the controller chip 500 can be embedded in the substrate 200 during the process of forming multilayer circuit board (substrate) so that the controller chip 500 is disposed within the substrate 200. Since embedding a controller chip 500 in a substrate 200 is a known technology, it is not described in detail herein. Apparently, the difference between FIG. 5F and FIG. 5E is that a controller chip 500 embedded in substrate 200 is further disposed in FIG. 5F, while the rest process of connecting the first chip 100a, the second chip 300a, the third chip 300b, and the fourth chip 100b is the same as what is shown in FIGS. 5B to 5E and is not repeatedly described.

Figure 6:
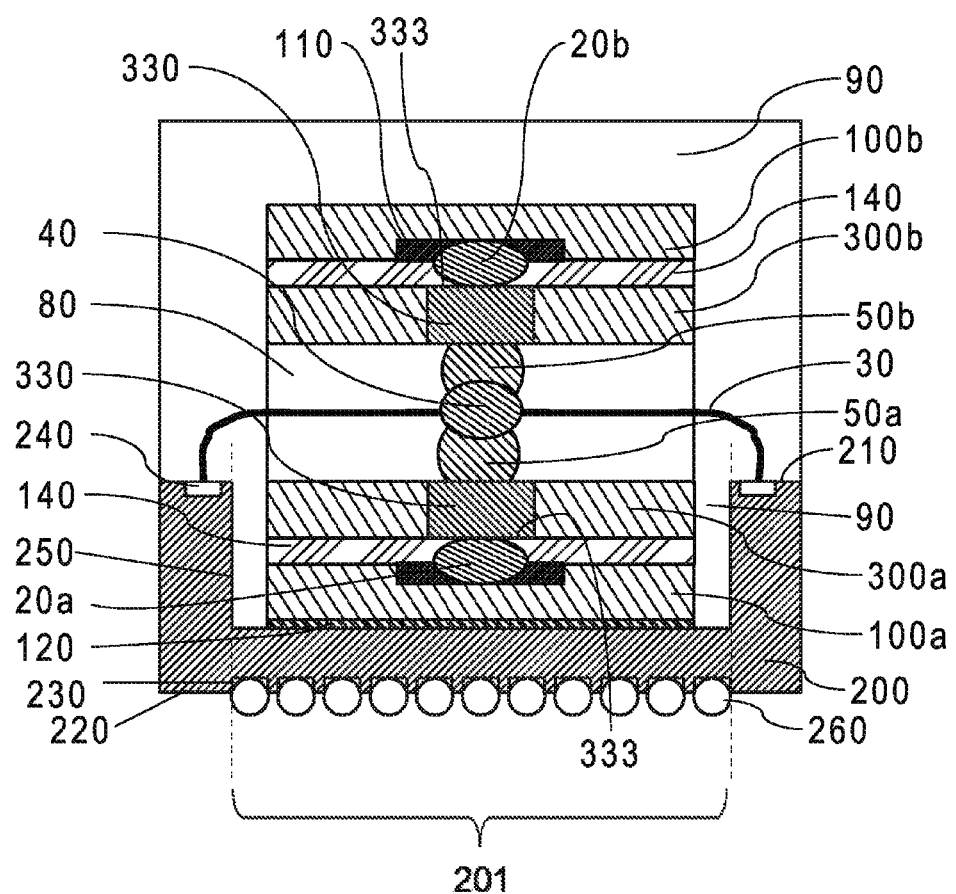
FIG. 6 is a cross-sectional view of an embodiment of multi-chip stack structure of the present invention formed on a substrate with cavity.

Then, referring to FIG. 6, which is a cross-sectional view of an embodiment of multi-chip stack structure of the present invention formed on a substrate with a cavity. As shown in FIG. 6, the multi-chip stack structure therein is similar to the multi-chip stack structure as shown in FIG. 5E and the only difference lies in the substrate 200. The substrate 200 in the present embodiment is the same as the substrate 200 as shown in FIG. 4. The upper surface 210 of the substrate 200, has a chip placement area 201 with a cavity 250 formed therein being defined thereupon and a plurality of contacts 240 are disposed on the upper surface 210 and outside the chip placement area 201. The length and width of the cavity 250 are larger than the length and width of the chip 100. After the first stack structure as shown in FIG. 5C is disposed in the cavity 250 of the substrate 200, a wire bonding process such as reverse wire bonding is performed to form a plurality of metal wires 30 electrically connecting the second bumps 50a on the second chip 300a to the contacts 240 on the substrate 200. Apparently, with proper design of cavity 250 in the substrate 200, for example, the depth of cavity 250 designed to be approximate to the thickness of the first stack structure comprising the chips 100a and 300a, the contacts 240 on the upper surface 210 of the substrate 200 and the second bumps 50a on the second chip 300a are at about the approximate height when the first stack structure is mounted into the cavity 250 of the substrate 200 with the rear surface 103 of the first chip 100a attached thereto. Thus the plurality of metal wires 30 electrically connecting the contacts 240 on the substrate 200 and the second bumps 50a on the second chip 300a can be with the lowest loop height and the shortest length, allowing the multi-chip stack structure to have the best electrical performance. The process of forming the multi-chip stack structure is the same as that of the aforementioned embodiment and is not repeatedly described here. Similarly, a polymer material filling process can be optionally performed in the present embodiment to form sealing layers 80/140 in the spaces between the chips 100a, 300a, 300b, and 100b to stabilize the stack structure and protect the electrical connections. An encapsulating process can also be performed to form an encapsulant 90 to encapsulate the substrate 200, the first chip 100a, the second chip 300a, the third chip 300b, the fourth chip 100b, and the metal wires 30, and the gaps between the first chip 100a and the second chip 300a and the cavity 250 are simultaneously filled with the encapsulant 90. The sealing layer filling process and the encapsulating process and the materials thereof are the same as those in the embodiment previously described and are not repeatedly described herein. Finally, solder balls 260 can be further disposed on the plurality of external terminals 230 on the lower surface 220 of the substrate 200 as external electrical connection components.

Apparently, in the embodiment shown in FIG. 6, the metal wires 30 with the most preferred length (ie. shortest) are used to connect the bumps 50a and 50b on the chips 300a and 300b to the contacts 240 on the substrate 200 so that better electrical performance and reliability can be achieved in the embodiment. Moreover, with the deployment of the cavity 250 on the substrate 200, the overall height of the multi-chip stack package structure can also be considerably reduced. Furthermore, as the structure in FIG. 3, a stud bump 40 can also be further formed on the contact point of each metal wire 30 and the second bump 50a after the metal wires 30 connect the second bumps 50a on the second chip 300a to the contacts 240 on the substrate 200 in the present embodiment to reinforce the bonding strength of the metal wires 30 and provide buffer for subsequent flip-chip bonding. Thus, better CTE (coefficients of thermal expansion) matching of metal electrode materials in the multi-chip stack package structure can be achieved and the reliability of the package structure can be improved.

Figure 7:
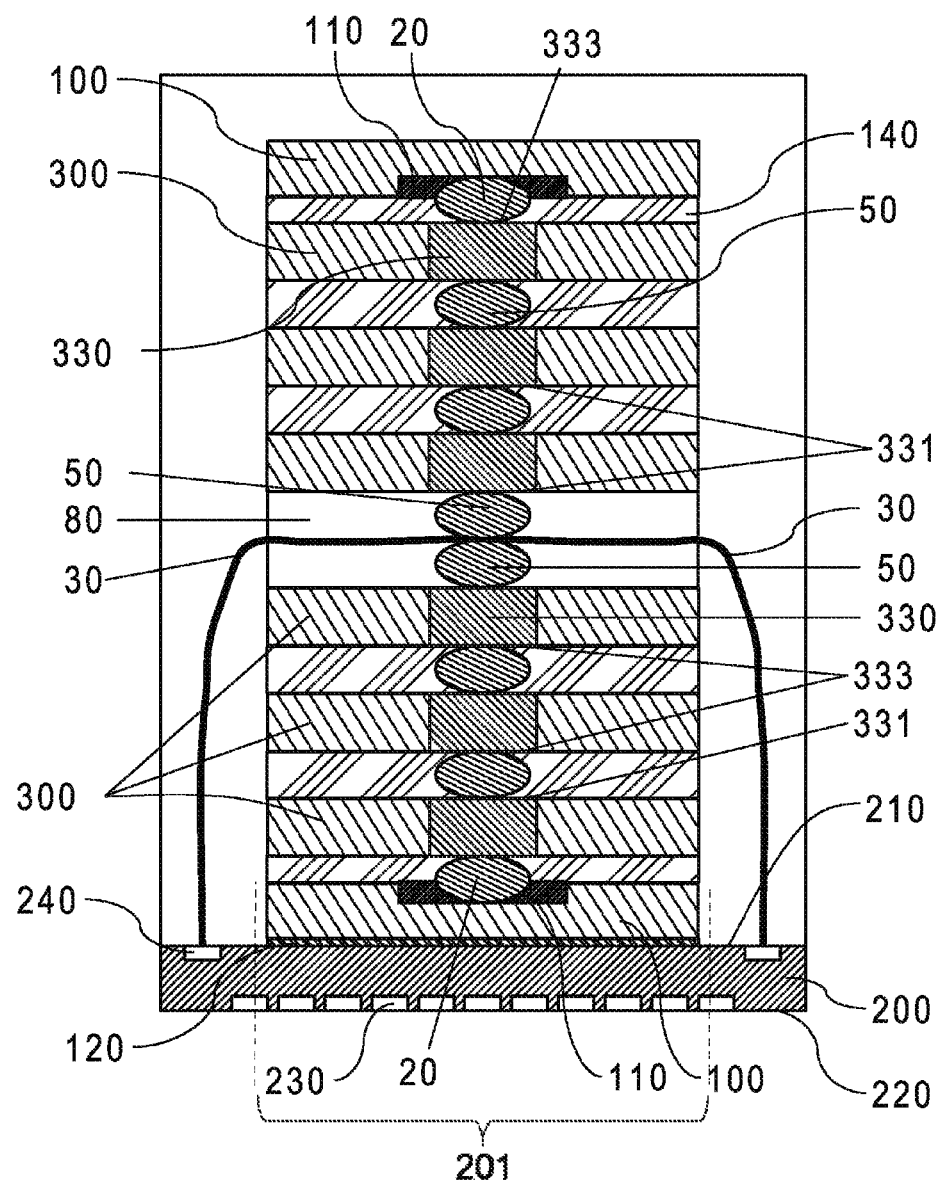
FIG. 7 is a cross-sectional view of yet another embodiment of multi-chip stack package structure of the present invention.

Then, referring to FIG. 7, which is a cross-sectional view of yet another embodiment of multi-chip stack package structure of the present invention. As shown in FIG. 7, first, three chips 300 having a plurality of TSVs 330 as shown in FIG. 5A are vertically stacked together, wherein a bump 50 is correspondingly formed on the first end 331 of each TSV 330 of each of the chips 300 as in FIG. 5A respectively; then, the bumps 50 of a chip 300 are correspondingly electrically connected to the second ends 333 of TSVs 330 of another chip 300 respectively. The stack structure formed by the three chips 300 is then electrically connected to a chip 100 as in FIG. 2C to form a first stack structure, wherein the second ends 333 of TSVs 330 of the bottom chip 300 are correspondingly connected to the bumps 20 of the chip 100 in the first stack structure. Subsequently, the bumps 50 on the uppermost chip 300 in the first stack structure are connected to the contacts 240 on the substrate 200 with a plurality of metal wires 30, which may be formed by a reverse wire bonding process optionally.

In addition, a second stack structure is formed by vertically stacking together three chips 300 having a plurality of TSVs 330 as shown in FIG. 5A and electrically connecting the stack structure of the three chips 300 to a chip 100 as shown in FIG. 2B following the same process; the process of forming this second stack structure is the same as that of forming the first stack structure and is not repeatedly described. Then, as shown in FIG. 7, the plurality of bumps 50 exposed on the second stack structure are correspondingly connected to the metal wires 30 and the plurality of bumps 50 exposed on the first stack structure respectively in flip-chip manner to form a multi-chip stack structure with eight chips 100/300. Similarly, a polymer material filling process can be optionally performed to form sealing layers 80/140 in the spaces between the first stack structure and the second stack structure and between the chips 100/300 to stabilize the multi-chip stack structure and protect the electrical connections. An encapsulating process can be then performed to form an encapsulant 90 to encapsulate the substrate 200, the eight chips 100/300, and the metal wires 30. The sealing layer filling process and the encapsulating process and the materials thereof are the same as those in the previous embodiment and are not repeatedly described herein. Finally, solder balls (not shown in FIG. 7) can be further disposed on the plurality of external terminals 230 on the lower surface 220 of the substrate 200 as external electrical connection components. Apparently, when each chip 100/300 in the stack structure is a 1 Gb DRAM, the multi-chip stack package structure would be an 8 Gb DRAM device, which can be applied in portable electronic products such as laptop computers, 3G mobile phones, PDA, and video game consoles.

Moreover, what is to be explained in particular is that, when the material of bumps 20 and 50 in the embodiment described above is a soft metal material such as gold, the properties of soft metal such as low hardness, high toughness, and good compliancy to coplanarity not only can compensate the longitudinal or vertical deformation occurring at the connection interface of electrodes (i.e. bumps) due to CTE (coefficients of thermal expansion) mismatch between metal electrode materials in the process of vertical multi-chip stacking, but also can effectively eliminate the problem of roughness of metal electrode materials. Therefore, the reliability of the process and products of vertical multi-chip stacking can be effectively improved.

Figure 8A:
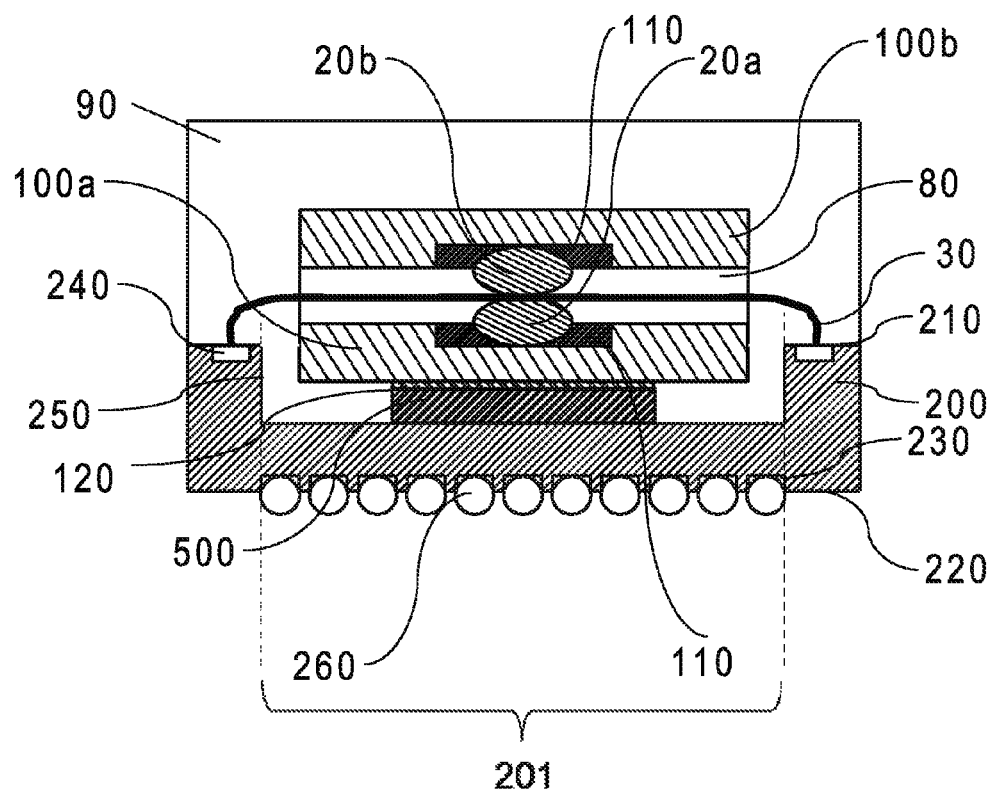
FIG. 8A to 8D are cross-sectional views of SiP structure formed by multi-chip stack package structure of the present invention.

Then, referring to FIG. 8A, which is a cross-sectional view of SiP structure formed by multi-chip stack package structure of the present invention. First, as shown in FIG. 8A, the substrate 200 is the same as the substrate 200 in FIG. 4. The upper surface 210 of the substrate 200 has a chip placement area 201 with a cavity 250 formed therein being defined thereupon and a plurality of contacts 240 are disposed on the upper surface 210 and outside the above-mentioned chip placement area 201. The length and width of the cavity 250 are larger than the length and width of the chip 100. In the present embodiment, a controller chip 500 is first disposed in the cavity 250 and electrically connected to the substrate 200. The electrical connection of the controller chip 500 can be formed in flip-chip manner so that the active surface of controller chip 500 faces the substrate 200 are is electrically connected to the plurality of terminals (not shown in Figure) disposed on the bottom of the cavity 250 of the substrate 200. Or the controller chip 500 can be mounted into the cavity 250 with its rear surface attached thereto and electrically connected to the substrate 20 with bonding wires which connect the pads on the active surface of the controller chip 500 to the terminals (not shown in Figure) disposed on the bottom of the cavity 250 of the substrate 200. Then, a FOW (Film-over-wire) film is formed over the active surface of the controller chip 500 covering the wires (not shown in Figure). Next, a first chip 100a as in FIG. 2B is adhered to the rear surface of the controller chip 500 with its rear surface 103 attached thereto via an adhesive layer 120 or directly adhered to the FOW film with its rear surface 103. A wire bonding process such as reverse wire bonding is then performed to form a plurality of metal wires 30 electrically connecting the bumps 20a on the first chip 100a to the contacts 240 on the substrate 200. Apparently, with proper design of cavity 250 in the substrate 200, for example, when the first chip 100a is adhered to the rear surface of the controller chip 500 or the FOW film, the height of the contacts 240 on the upper surface 210 of the substrate 200 is approximate to the height of the bumps 20a on the first chip 100a, the plurality of metal wires 30 can thus electrically connect the contacts 240 on the substrate 200 and the bumps 20a on the first chip 100a with the lowest loop height and the shortest length, allowing the multi-chip stack structure to have the best electrical performance. Then, bumps 20b on a second chip 100b as shown in FIG. 2B are correspondingly connected to the metal wires 30 and bumps 20a on the first chip 100a disposed in the cavity 250 in flip-chip manner to form a multi-chip stack structure. Similarly, a polymer material filling process can be optionally performed to form a sealing layer 80 between the chips 100a and 100b to stabilize the stack structure and protect the electrical connections. An encapsulating process is then performed to form an encapsulant 90 to encapsulate the substrate 200, the first chip 100a, the second chip 100b, and the metal wires 30, and the gaps between the controller chip 500 and the first chip 100a and the cavity 250 is simultaneously filled with the encapsulant 90. The sealing layer filling process and encapsulating process and the materials thereof are the same as those in the aforementioned embodiment and are not repeatedly described herein. Finally, solder balls 260 can be further disposed on the plurality of external terminals 230 on the lower surface 220 of the substrate 200 as external electrical connection components. Apparently, with the deployment of controller chip 500, the multi-chip stack package structure of the present embodiment forms a SiP (system-in-package). When each chip 100 is a 1 Gb DRAM, the controller chip 500 of the multi-chip stack package structure of the present embodiment can be used to control the storage of 2 Gb DRAM to achieve qualities such as higher capacity, higher operation speed, and larger bandwidth. Thus the multi-chip stack package structure can be applied in portable electronic products such as laptop computers, 3G mobile phones, PDA, and video game consoles.

Figure 8B:
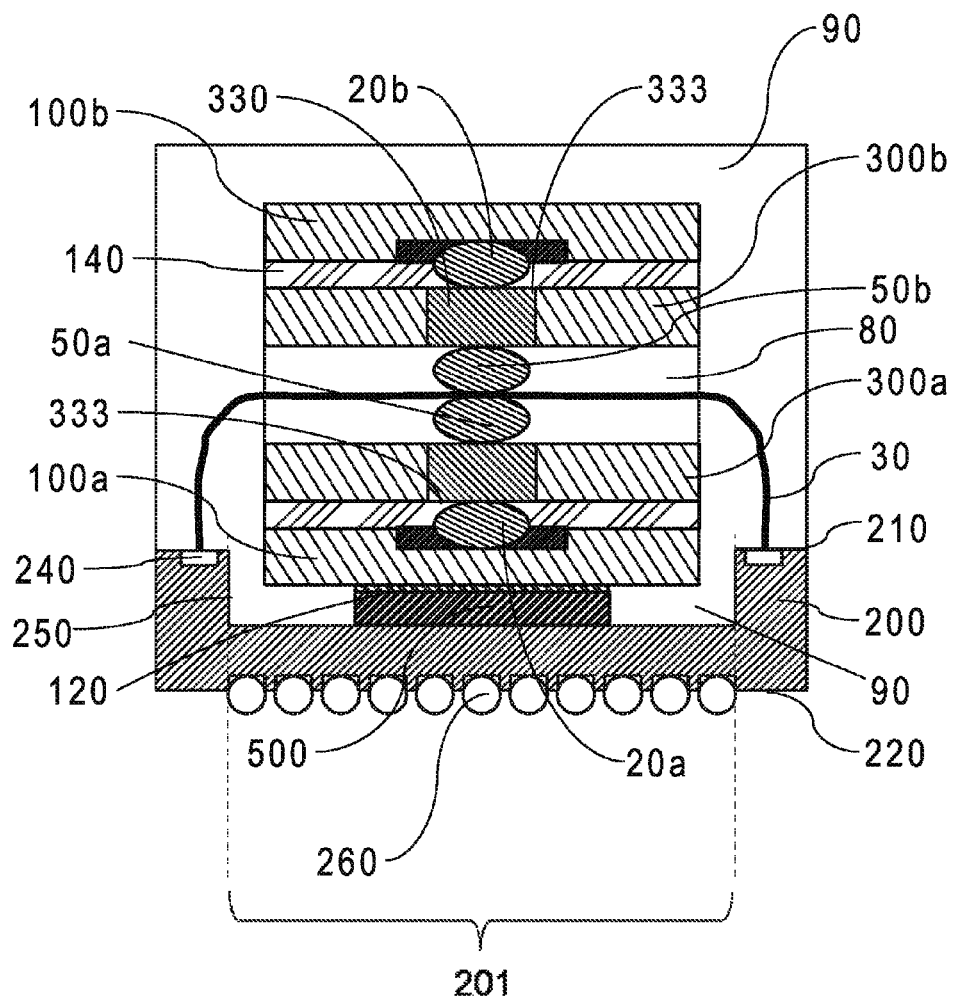

Referring then to FIG. 8B, which is a cross-sectional view of another embodiment of SiP structure formed by multi-chip stack package structure of the present invention. Apparently, the difference between FIG. 8B and FIG. 8A is that in FIG. 8B a stack structure of four chips 100/300 is attached to the controller chip 500. The methods of connecting the controller chip 500 to the substrate 200 and to the bottom chip 100 of the stack structure are the same as those described in FIG. 8A, and the process of stacking together the four chips 100/300 and the stack structure are the same as those described in FIG. 5E; thus the detailed descriptions are omitted herein. Apparently, with the deployment of controller chip 500, the multi-chip stack package structure of the present embodiment forms a SiP. When each chip is a 1 Gb DRAM, the controller chip 500 of the multi-chip stack package structure of the present embodiment can be used to control the storage of 4 Gb DRAM to achieve qualities such as higher capacity, higher operation speed, and larger bandwidth. Thus the multi-chip stack package structure can be applied in portable electronic products such as laptop computers, 3G mobile phones, PDA, and video game consoles.

Figure 8C:
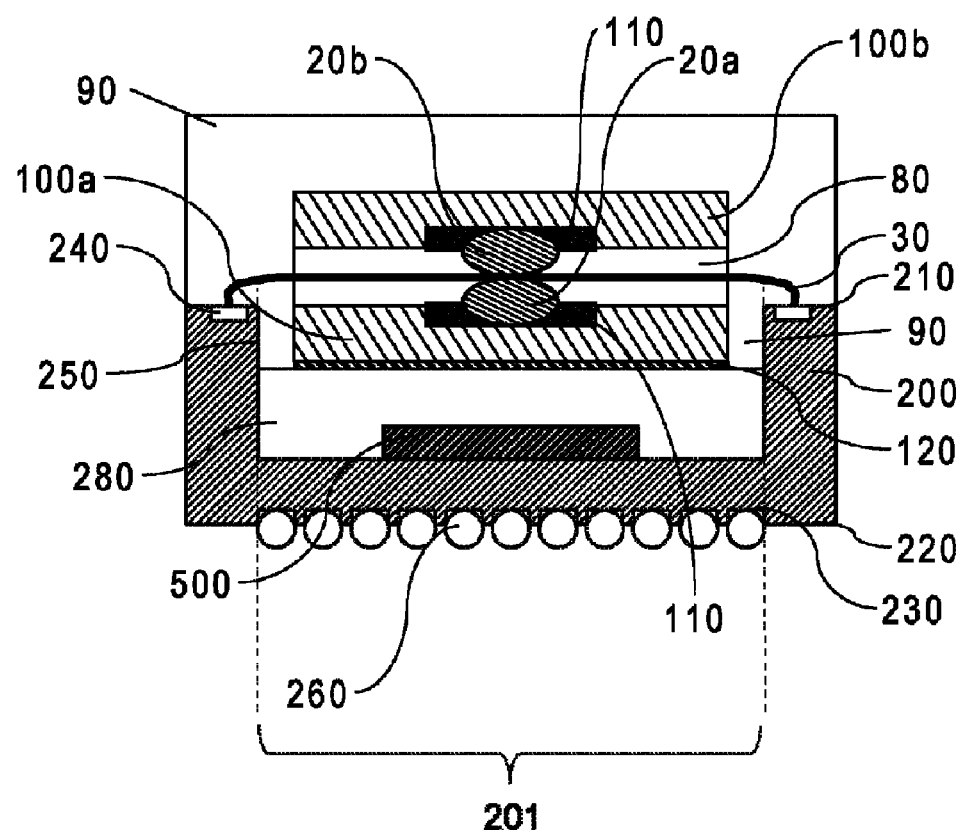

Then, referring to FIG. 8C, which is a cross-sectional view of still another embodiment of SiP structure formed by multi-chip stack package structure of the present invention. Similar to that in FIG. 8A, a cavity 250 is formed in the chip placement area 201 on the substrate 200 in FIG. 8C, and a controller chip 500 is mounted into the cavity 250 and electrically connected to the substrate 200, wherein the method of electrically connecting the controller chip 500 to the substrate 200 is the same as that described in FIG. 8A. Then a filling material partially fills in the cavity 250 to form a cap layer 280 covering the controller chip 500 and filling the gaps between the controller chip 500 and the cavity 250. The multi-chip stack structure as shown in FIG. 8A is subsequently formed on the cap layer 280. The process of forming multi-chip stack structure is the same as that of the embodiment previously described and is not repeatedly described herein.

Figure 8D:
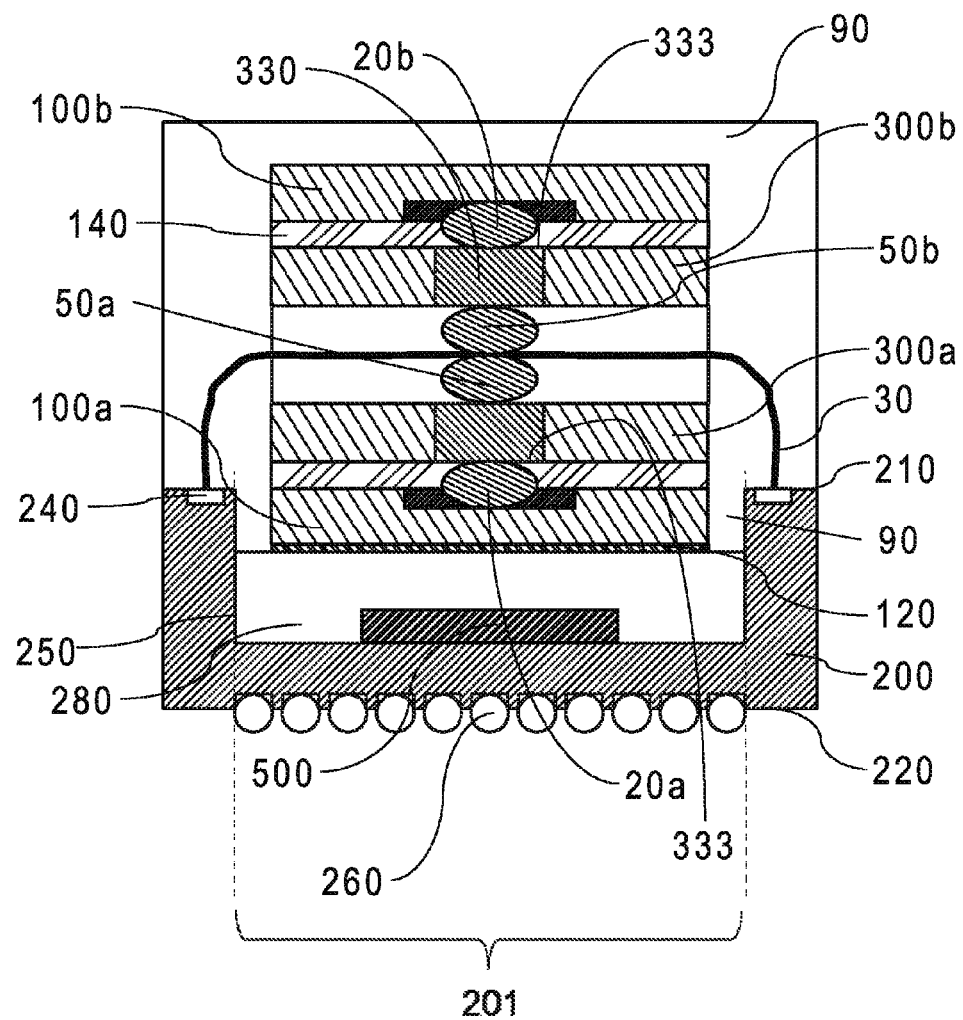

Then, referring to FIG. 8D, which is a cross-sectional view of yet another embodiment of SiP structure formed by multi-chip stack package structure of the present invention. Apparently, the structure in FIG. 8D is similar to that in FIG. 8C except the number of chips stacked. The controller chip 500 is mounted into the cavity 250; a filling material partially fills in the cavity 250 to form a cap layer 280 covering the controller chip 500 and filling the gaps between the controller chip 500 and the cavity 250; a stack structure of four chips 100/300 as that shown in FIG. 8B is subsequently formed on the cap layer 280. The process of electrically connecting the controller chip 500 to the substrate 200 is the same as that described in FIG. 8A and the process of forming the multi-chip stack structure is the same as that of the embodiment previously described; the processes are thus not repeatedly described herein.

Apparently, with the deployment of the controller chip 500, the multi-chip stack package structure of the present embodiment forms a SiP. When each chip is a 1 Gb DRAM, the controller chip 500 of the multi-chip stack package structure of the present embodiment can be used to control the storage of 2 Gb DRAM (as in the structure in FIG. 8C) or of 4 Gb DRAM (as in the structure in FIG. 8D) to achieve qualities such as higher capacity, higher operation speed, and larger bandwidth. Thus the multi-chip stack package structure can be applied in portable electronic products such as laptop computers, 3G mobile phones, PDA, and video game consoles.

Figure 9:
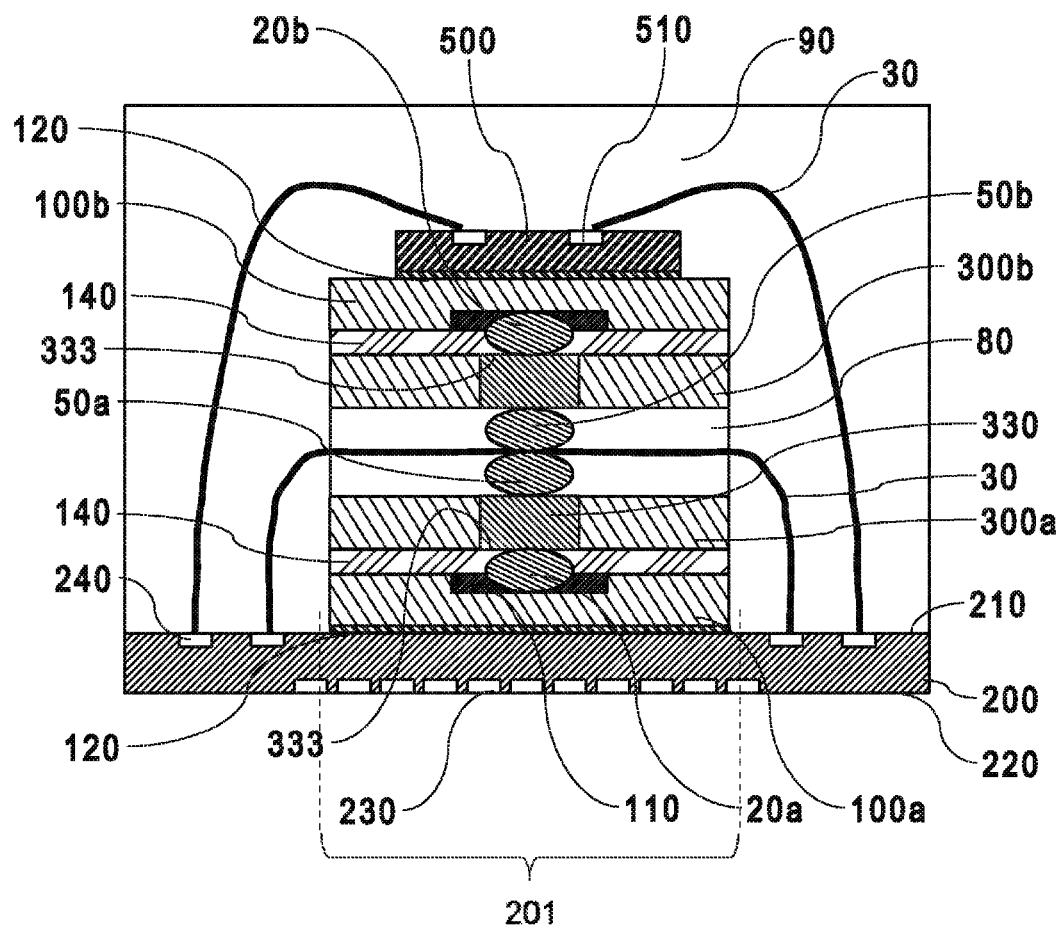
FIG. 9 is a cross-sectional view of still another embodiment of SiP structure formed by multi-chip stack package structure of the present invention.

And then, referring to FIG. 9, which is a cross-sectional view of still another embodiment of SiP structure formed by multi-chip stack package structure of the present invention. As shown in FIG. 9, a controller chip 500 is further mounted on the rear surface 103 of the uppermost chip 100 (the fourth chip 100b) of the multi-chip stack structure as shown in FIG. 5E, and then another wire bonding process is performed to electrically connect the plurality of pads 510 on the controller chip 500 to the contacts 240 on the upper surface 210 of the substrate 200. Therefore, a SiP can also be formed in the present embodiment, and the controller chip 500 can be used to control the storage of 2 Gb DRAM to achieve qualities such as higher capacity, higher operation speed, and larger bandwidth.

Figure 10A:
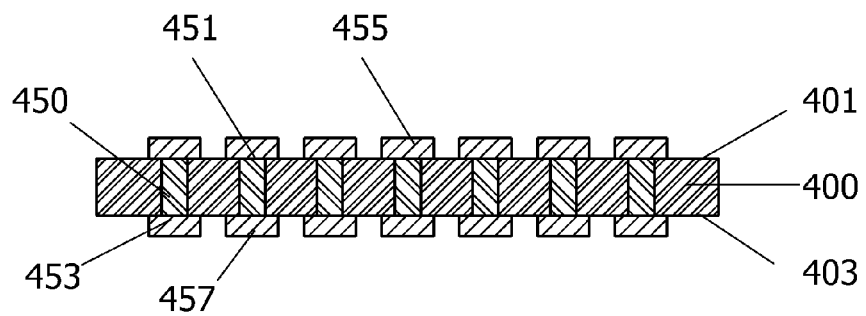
FIG. 10A to 10D are cross-sectional views of another embodiment of multi-chip stack package structure with TSVs of the present invention.
Figure 10B:
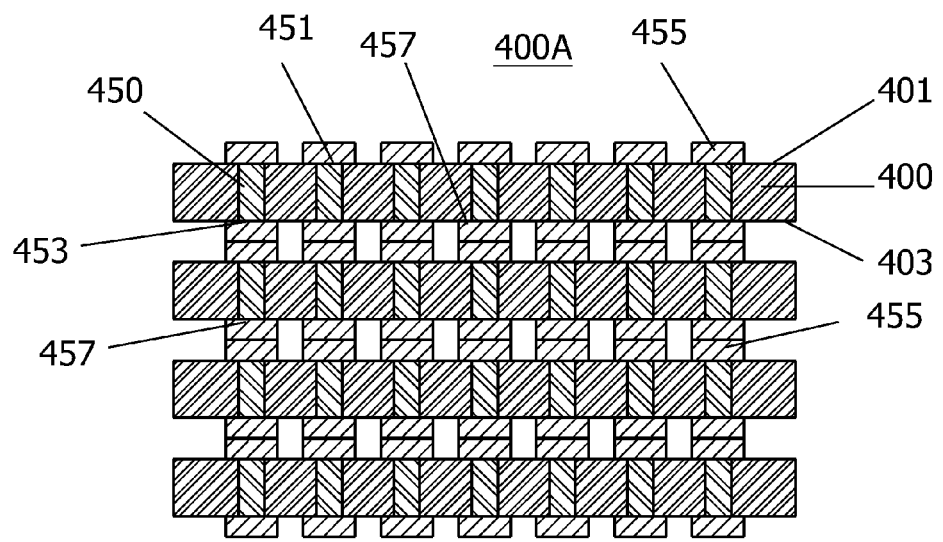

Then, referring to FIGS. 10A to 10D, which are cross-sectional views of yet another embodiment of the multi-chip stack structure having a plurality of TSVs of the present invention. First, as shown in FIG. 10A, a sectional view of a chip 400 having a plurality of TSVs of the present invention is disclosed. The chip 400 has an active surface 401 and a rear surface 403 opposite to the active surface 401, and a plurality of vertical through holes penetrating through the chip 400. A TSV 450 is further formed in each of the vertical through holes interconnecting the active surface 401 and the rear surface 403. The method for forming through holes and the material of TSV 450 are the same as those described in FIG. 5A. In the present embodiment, the plurality of TSVs 450 form the first ends 451 on the active surface 401 and form the second ends 453 on the rear surface 403. Bumps 457 protruding from the rear surface 403 of the chip 400 are formed on the second ends 453 of a portion of the plurality of TSVs 450 respectively, and bumps 455 protruding from the active surface 401 of the chip 400 are formed on the first ends 451 of a portion of the plurality of TSVs 450 respectively. The bump 455 and the bump 457 can be an integral part of the TSV 450, i.e. they are integrally formed with the TSVs 450 in the same material, or can be respectively formed on the first end 451 and the second end 453 of the TSV 450 with other electrically conductive materials. Then, a plurality of chips 400 as shown in FIG. 10A are vertically stacked to form a stack structure 400A, as shown in FIG. 10B. The stack structure 400A in FIG. 10B is formed with the bumps 457 on the second ends 453 of the plurality of TSVs 450 of each upper chip 400 being correspondingly connected to the bumps 455 on the first ends 451 of the plurality of TSVs 450 of each lower chip 400 respectively. In the present embodiment, four chips 400 are stacked to form a multi-chip stack structure 400A. In addition, in another embodiment, each chip 400 can be arranged without bumps 455 formed on the first ends 451 of the plurality of TSVs 450 of the chip 400; therefore, the stack structure as shown in FIG. 10B is formed with the bumps 457 on the second ends 453 of the plurality of TSVs 450 of each upper chip 400 being correspondingly and directly connected to the first ends 451 of the plurality of TSVs 450 of each lower chip 400 respectively.

Figure 10C:
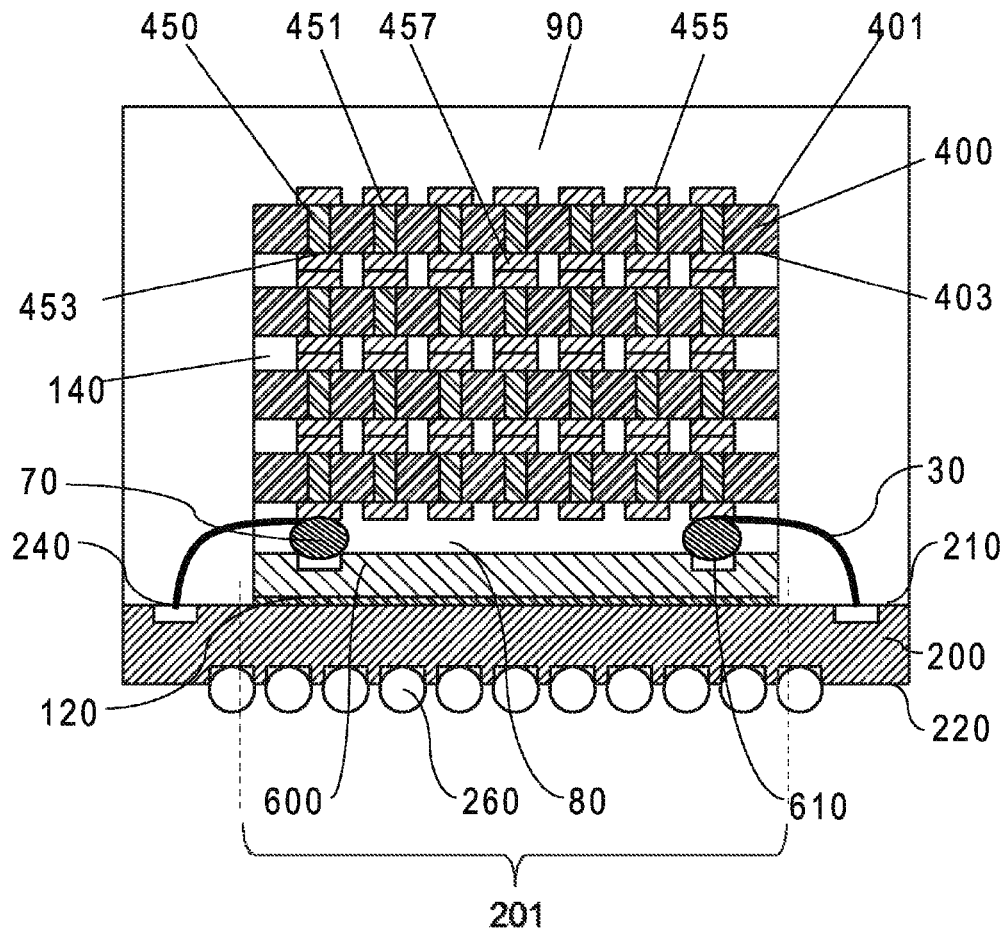

The stack structure 400A shown in FIG. 10B is then electrically connected to another chip 600 which is mounted on the active surface 210 of the substrate 200, as shown in FIG. 10C. The chip 600 has an active surface and a rear surface opposite to the active surface and is mounted in the chip placement area 201 of the substrate 200 with its rear surface. A plurality of pads 610 are disposed on the peripheral regions of the active surface of the chip 600 and bumps 70 are formed on the pads 610 respectively. The bumps 70 on the pads 610 are then electrically connected to the plurality of contacts 240 on the active surface 210 of the substrate 200 with metal wires 30. Then, the stack structure 400A is electrically connected to the chip 600 so that the bumps 457 on the second ends 453 of TSVs 450 of the lowermost chip 400 of the stack structure 400A are correspondingly connected to the metal wires 30 and the bumps 70 on the chip 600 respectively, and the multi-chip stack structure as shown in FIG. 10C is formed. In particular, in the present embodiment, the plurality of TSVs 450 located in the central areas of the chips 400 can be electrically connected to the TSVs 450 in the peripheral regions via traces laid out in the chips 400 (not shown in Figure), and then further connected to the metal wires 30 and the bumps 70 on the chip 600 via the bumps 457 on the TSVs 450 in the peripheral regions correspondingly. In the present embodiment, the chip 600 can be of the same function as the chip 100/300 such as DRAM or of function different from that of the chip 100/300, for example, Flash Memory or a dummy die without any function, i.e., an interposer. The chip 600 can also be a controller chip or an ASIC such as DSP, CPU, MCU, etc., which is not limited in the present invention.

Then, a polymer material filling process can be optionally performed in the present embodiment to form a sealing layer 140 between the chips 400 of the stack structure 400A and a sealing layer 80 between the stack structure 400A and the chip 600 to stabilize the multi-chip stack structure and protect the electrical connections. Then, an encapsulating process can also be performed to form an encapsulant 90 to encapsulate the substrate 200, the stack structure 400A, the chip 600, and the metal wires 30. The sealing layer filling process and the encapsulating process and the materials thereof are the same as those described in the aforementioned embodiment and are not repeatedly described herein. Finally, solder balls 260 can be further disposed on the plurality of external terminals 230 on the lower surface 220 of the substrate 200 as external electrical connection components, as shown in FIG. 10C.

Figure 10D:
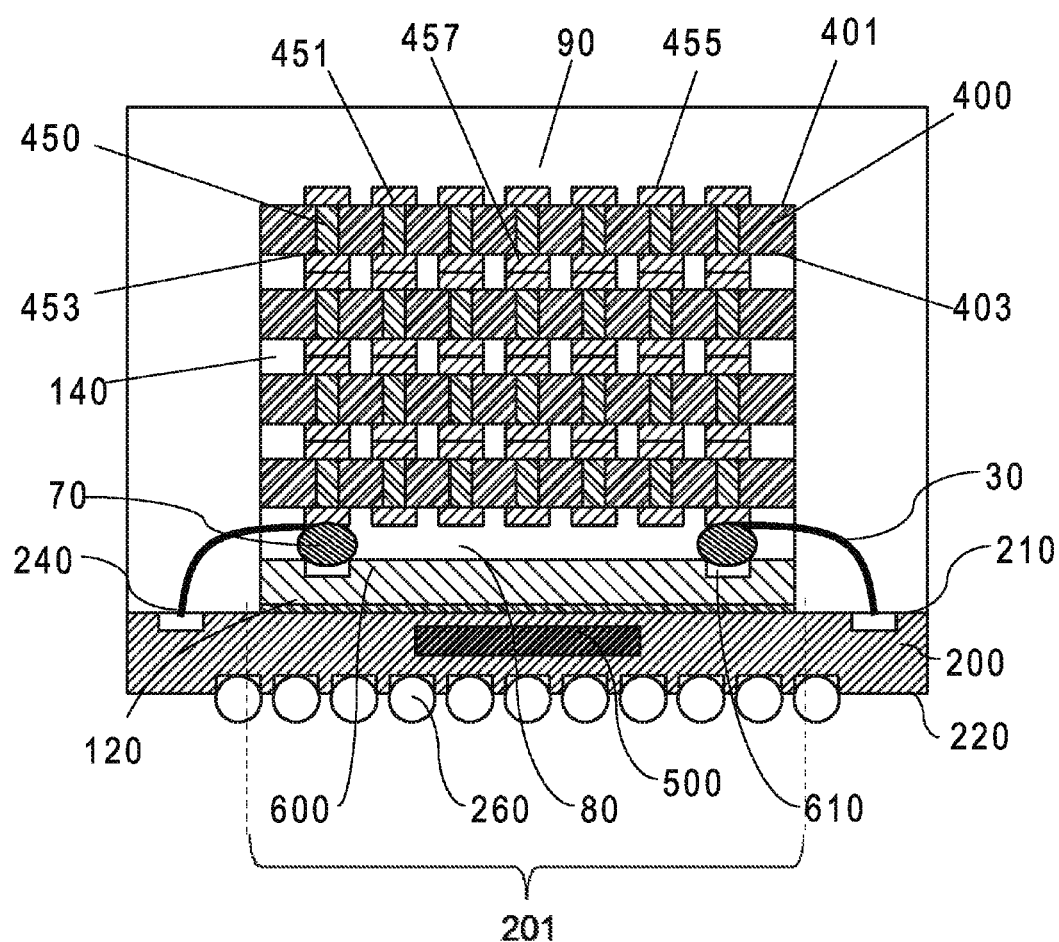

Moreover, referring to FIG. 10D, a controller chip 500 can be embedded in the substrate 200 as shown in FIG. 10C in the present invention, wherein the method for forming the controller chip 500 in the substrate 200 is the same as described in FIG. 2I and the detailed description is omitted herein.

Figure 11:
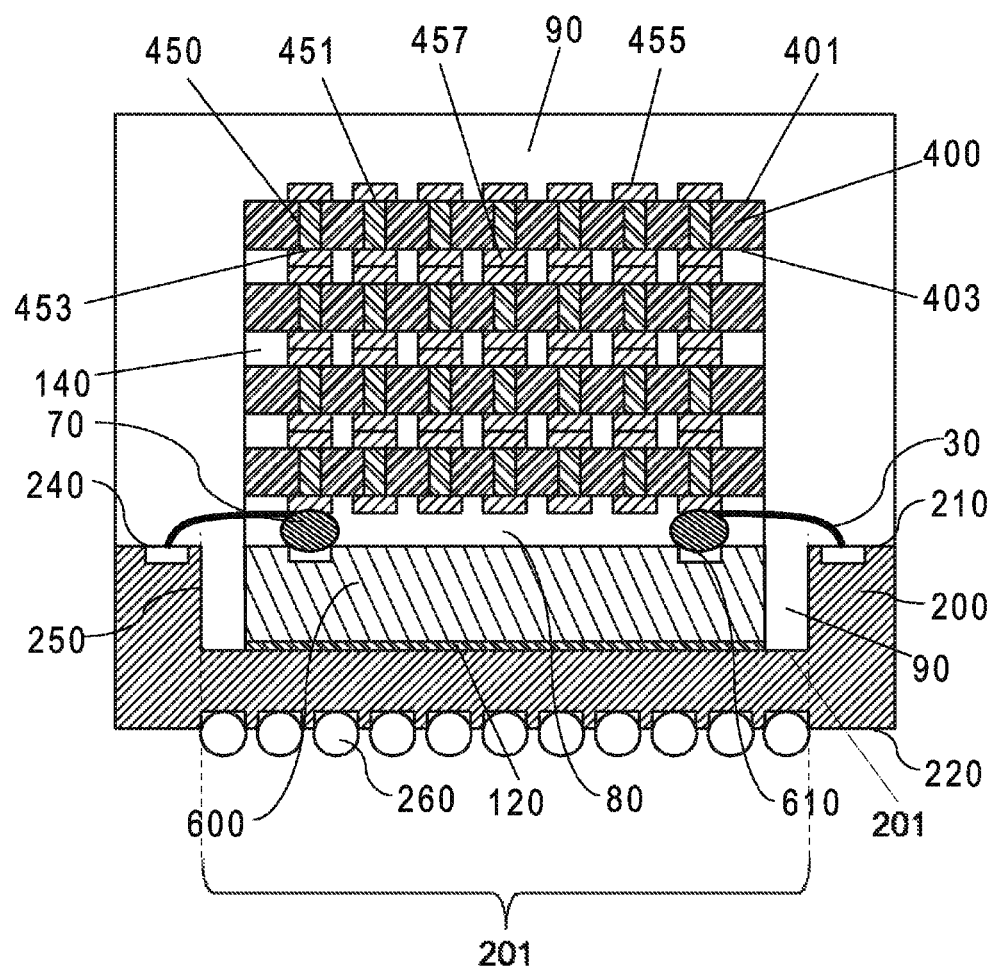
FIG. 11 is a cross-sectional view of still another embodiment of multi-chip stack package structure with TSVs of the present invention.

Referring then to FIG. 11, which is a cross-sectional view of still another embodiment of multi-chip stack structure having a plurality of TSVs of the present invention. As shown in FIG. 11, the stack structure 400A, the chip 600, and the plurality of metal wires 30 in the embodiment are the same as those in the embodiment shown in FIG. 10C, and the major difference between these two embodiments lies in the substrate 200. The substrate 200 in the present embodiment is the same as that shown in FIG. 4, where a cavity 250 is formed in a chip placement area 201 defined on the upper surface 210 of the substrate 200 and a plurality of contacts 240 are disposed outside the chip placement area 201. The length and width of the cavity 250 are larger than the length and width of the chip 600. After the chip 600 in FIG. 11 is mounted into the cavity 250 of the substrate 200 with an adhesive layer 120, wire bonding process such as reverse wire bonding is then performed to form a plurality of metal wires 30 for electrically connecting bumps 70 on the pads 610 of the chip 600 to the contacts 240 on the substrate 200. Apparently, with proper design of cavity 250 in the substrate 200, for example, the depth of the cavity 250 designed to be approximate to the thickness of the chip 600, the contacts 240 on the upper surface 210 of the substrate 200 and the bumps 70 on the chip 600 can thus be at about the approximate height after the chip 600 is mounted into the cavity 250 of the substrate 200. The plurality of metal wires 30 can thus electrically connect the contacts 240 on the substrate 200 to the bumps 70 on the chip 600 with the lowest loop height and the shortest length, allowing the multi-chip stack structure to have the best electrical performance. The process for forming the multi-chip stack structure is the same as that described in the previous embodiment and is not repeated herein. Similarly, a polymer material filling process can be optionally performed in the present embodiment to form sealing layers 140 and 80 between chips 400 of the stack structure 400A and between the stack structure 400A and the chip 600 to stabilize the multi-chip stack structure and protect the electrical connections. Then, an encapsulating process can also be performed to form an encapsulant 90 to encapsulate the substrate 200, the stack structure 400A, the chip 600, and the metal wires 30, and the gaps between the chip 600 and the cavity 250 are simultaneously filled with the encapsulant 90. The sealing layer filling process and the encapsulating process and the materials thereof are the same as those described in the aforementioned embodiment and are not repeatedly described herein. Finally, solder balls 260 are further disposed on the plurality of external terminals 230 on the lower surface 220 of the substrate 200 as external electrical connection components.

Figure 12:
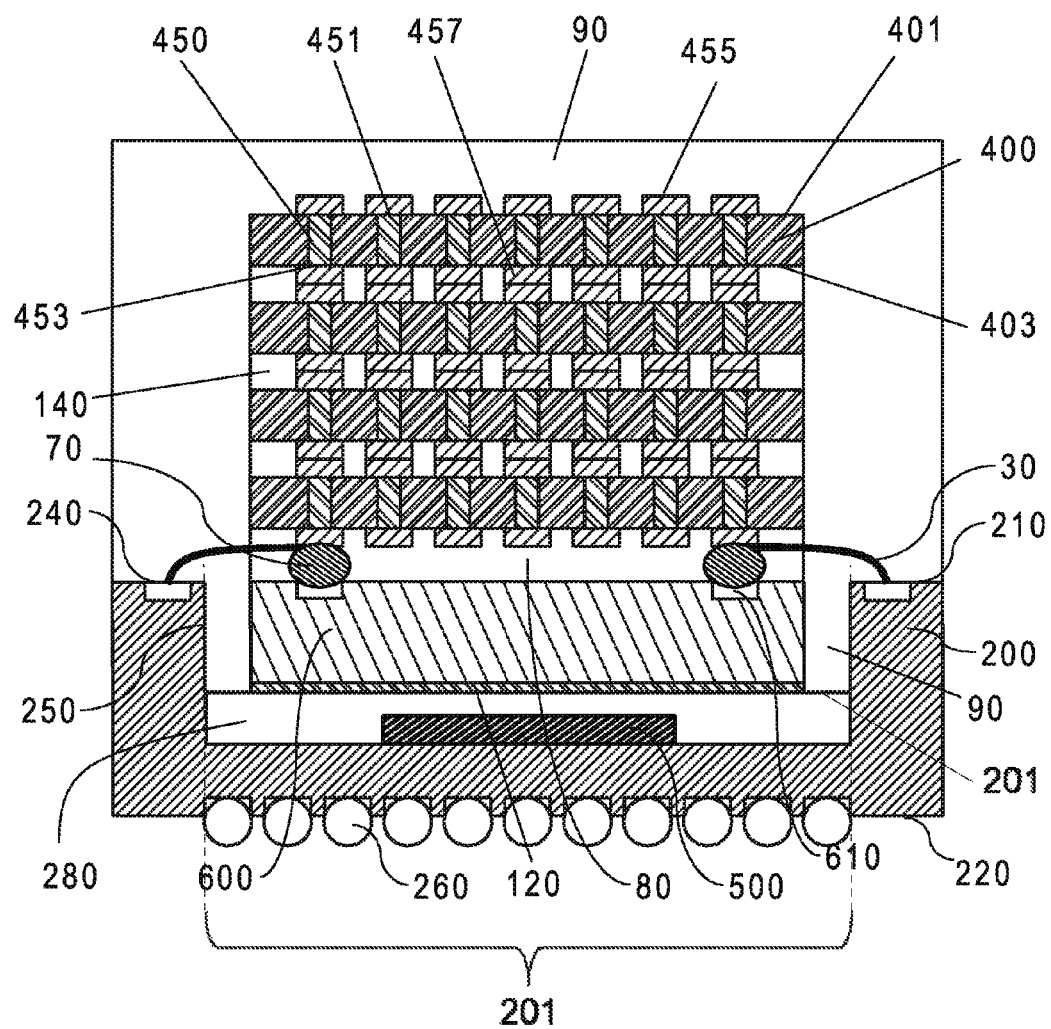
FIG. 12 is a cross-sectional view of another embodiment of SiP structure formed by multi-chip stack package structure with TSVs of the present invention.

Then, referring to FIG. 12, which is a sectional view of yet another embodiment of SiP structured formed by multi-chip stack package structure of the present invention. As shown in FIG. 12, the chip stack structure is the same as that in FIG. 11, and the difference between the two multi-chip stack structures is that a controller chip 500 is further disposed in the cavity 250 of the substrate 200 in the present embodiment and electrically connected to the substrate 200. The controller chip 500 can be electrically connected to the substrate 200 either by flip-chip bonding so as to electrically connect the active surface of the controller chip 500 to the plurality of terminals (not shown in Figure) on the bottom of the cavity 250 of the substrate 200, or by wire bonding so as to first mount the rear surface of the controller chip 500 into the cavity 250 and then forming bonding wires to electrically connect the pads on the active surface of the controller chip 500 to the terminals (not shown in Figure) on the bottom of the cavity 250 of the substrate 200. A filling material can then be optionally filled in the cavity 250 to form a cap layer 280 to cover the controller chip 500 and fill the gaps between the controller chip 500 and the cavity 250. Finally, a multi-chip stack package structure as shown in FIG. 12 is formed on the cap layer 280 to form a SiP structure.

While the invention has been described by way of examples and in terms of the preferred embodiments, it is to be understood that the invention is not limited to the disclosed embodiments. To the contrary, it is intended to cover various modifications and similar arrangements that would be apparent to those skilled in the art and are to be encompassed by the appended claims, the scope of which should be accorded the broadest interpretation.

What is claimed is:

1. A multi-chip stack package structure, comprising:
a substrate, having an upper surface and a lower surface, said upper surface having a chip placement area being defined and a plurality of contacts being disposed thereon, said plurality of contacts being located outside said chip placement area;
a first chip, having an active surface and a rear surface opposite to said active surface, said first chip being disposed in said chip placement area with said rear surface, a plurality of first pads being disposed on said active surface and a plurality of first bumps each being formed on one of said plurality of first pads;
a second chip, having an active surface, a rear surface opposite to said active surface and a plurality of through silicon vias, said plurality of through silicon vias penetrating through said second chip interconnecting said active surface and said rear surface, a plurality of second bumps being formed on said active surface and respectively connected to said plurality of through silicon vias, wherein said second chip is mounted to said first chip with said rear surface of said second chip facing said active surface of said first chip and said plurality of through silicon vias being correspondingly connected to said plurality of first bumps respectively;
a plurality of metal wires, connecting said plurality of second bumps to said plurality of contacts; a third chip, having an active surface, a rear surface opposite to said active surface and a plurality of through silicon vias, said plurality of through silicon vias penetrating through said third chip interconnecting said active surface and said rear surface, a plurality of third bumps being formed on said active surface and respectively connected to said plurality of through silicon vias, wherein said third chip is mounted to said second chip with said active surface of said third chip facing said active surface of said second chip and said plurality of third bumps being correspondingly connected to said plurality of metal wires and said plurality of second bumps respectively;
a fourth chip, having an active surface and a rear surface opposite to said active surface, a plurality of second pads being disposed on said active surface and a plurality of fourth bumps each being formed on one of said plurality of second pads, said fourth chip being mounted to said third chip with said active surface of said fourth chip facing said rear surface of said third chip and said plurality of fourth bumps being correspondingly connected to said plurality of through silicon vias of said third chip respectively; and
an encapsulant, encapsulating said substrate, said first chip, said second chip, said third chip, said fourth chip, and said plurality of metal wires.

2. The package structure according to claim 1, wherein said plurality of first pads are located in a central area of said active surface of said first chip and said plurality of second pads are located in a central area of said active surface of said fourth chip, said plurality of through silicon vias being respectively disposed in a central areas of said second chip and of said third chip.

3. The package structure according to claim 1, further comprising a controller chip being embedded in said substrate and electrically connected to said substrate.

4. The package structure according to claim 1, further comprising at least a fifth bump disposed between each of said plurality of metal wires and each of said plurality of third bumps.

5. The package structure according to claim 4, wherein said plurality of bumps are electroplated bumps, electroless bumps, stud bumps, conductive polymer bumps, compliant bumps or metal composite bumps.

6. The package structure according to claim 1, wherein a sealing layer is respectively formed between said plurality of chips.

7. A multi-chip stack package structure, comprising:
a substrate, having an upper surface and a lower surface, said upper surface having a chip placement area being defined and a plurality of contacts being disposed thereon, a cavity being formed in said chip placement area, said plurality of contacts being located outside said chip placement area;

a first chip, having an active surface and a rear surface opposite to said active surface, said first chip being disposed in said cavity with said rear surface, a plurality of first pads being disposed on said active surface and a plurality of first bumps each being formed on one of said plurality of first pads;

a second chip, having an active surface, a rear surface opposite to said active surface and a plurality of through silicon vias, said plurality of through silicon vias penetrating through said second chip interconnecting said active surface and said rear surface, a plurality of second bumps being formed on said active surface and respectively connected to said plurality of through silicon vias, wherein said second chip is mounted to said first chip with said rear surface of said second chip facing said active surface of said first chip and said plurality of through silicon vias being correspondingly connected to said plurality of first bumps respectively;

a plurality of metal wires, connecting said plurality of second bumps to said plurality of contacts; a third chip, having an active surface, a rear surface opposite to said active surface and a plurality of through silicon vias, said plurality of through silicon vias penetrating through said third chip interconnecting said active surface and said rear surface, a plurality of third bumps being formed on said active surface and respectively connecting said plurality of through silicon vias, wherein said third chip is mounted to said second chip with said active surface of said third chip facing said active surface of said second chip and said plurality of third bumps being correspondingly connected to said plurality of metal wires and said plurality of second bumps respectively;

a fourth chip, having an active surface and a rear surface opposite to said active surface, a plurality of second pads being disposed on said active surface and a plurality of fourth bumps each being formed on one of said plurality of second pads, said fourth chip being mounted to said third chip with said active surface of said fourth chip facing said rear surface of said third chip and said plurality of fourth bumps being correspondingly connected to said plurality of through silicon vias of said third chip respectively; and an encapsulant, encapsulating said substrate, said first chip, said second chip, said third chip, said fourth chip, and said plurality of metal wires.

8. The package structure according to claim 7, wherein said plurality of first pads are located in a central area of said active surface of said first chip and said plurality of second pads are located in a central area of said active surface of said fourth chip, said plurality of through silicon vias being respectively disposed in a central areas of said second chip and of said third chip.

9. The package structure according to claim 7, further comprising a controller chip disposed in said cavity and located between said first chip and said substrate, said rear surface of said first chip being mounted on said controller chip, said controller chip being electrically connected to said substrate.

10. The package structure according to claim 7, further comprising a controller chip disposed in said cavity and located between said first chip and said substrate, said controller chip being covered by a cap layer, said rear surface of said first chip being mounted on said cap layer, said controller chip being electrically connected to said substrate.

11. The package structure according to claim 7, further comprising at least a fifth bump disposed between each of said plurality of metal wires and each of said plurality of third bumps.

12. The package structure according to claim 11, wherein said plurality of bumps are electroplated bumps, electroless bumps, stud bumps, conductive polymer bumps, compliant bumps or metal composite bumps.

13. The package structure according to claim 7, wherein a sealing layer is respectively formed between said plurality of chips.

* * * * *